US 7,649,221 B2

(12) United States Patent
Sakuma et al.

(10) Patent No.: US 7,649,221 B2
(45) Date of Patent: *Jan. 19, 2010

(54) NONVOLATILE SEMICONDUCTOR MEMORY AND A FABRICATION METHOD FOR THE SAME

(75) Inventors: Makoto Sakuma, Tokyo (JP); Atsuhiro Sato, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

This patent is subject to a terminal disclaimer.

(21) Appl. No.: 11/951,026

(22) Filed: Dec. 5, 2007

(65) Prior Publication Data

US 2008/0079058 A1  Apr. 3, 2008

Related U.S. Application Data

(63) Continuation of application No. 10/971,161, filed on Oct. 25, 2004, now Pat. No. 7,335,938.

(30) Foreign Application Priority Data

Mar. 10, 2004 (JP) .............................. 2004-067712

(51) Int. Cl.
*H01L 29/72* (2006.01)
(52) U.S. Cl. ....................... 257/314; 257/316; 257/321; 257/322
(58) Field of Classification Search .................. 257/314, 257/315, 316, 321, 322
See application file for complete search history.

(56) References Cited

U.S. PATENT DOCUMENTS

| 6,445,030 | B1 * | 9/2002 | Wu et al. ..................... 257/315 |
| 6,835,978 | B2 * | 12/2004 | Matsui et al. ................ 257/316 |
| 7,335,938 | B2 * | 2/2008 | Sakuma et al. .............. 257/314 |
| 2002/0036317 | A1 | 3/2002 | Matsui et al. |
| 2003/0156460 | A1 * | 8/2003 | Wu ........................ 365/185.33 |
| 2005/0142751 | A1 * | 6/2005 | Jung .......................... 438/257 |

OTHER PUBLICATIONS

Riichiro Shirota; "A Review of 256 Mbit NAND Flash memories and NAND Flash Future Trend"; Non-Volatile Semiconductor Memory Workshop; Feb. 2000; Feb. 13-16, 2000; pp. 22-31.

* cited by examiner

*Primary Examiner*—Edward Wojciechowicz
(74) *Attorney, Agent, or Firm*—Oblon, Spivak, McClelland, Maier & Neustadt, L.L.P.

(57) ABSTRACT

A nonvolatile semiconductor memory includes a plurality of memory cell transistors configured with a first floating gate, a first control gate, and a first inter-gate insulating film each arranged between the first floating gate and the first control gate, respectively, and which are aligned along a bit line direction; device isolating regions disposed at a constant pitch along a word line direction making a striped pattern along the bit line direction; and select gate transistors disposed at each end of the alignment of the memory cell transistors, each configured with a second floating gate, a second control gate, a second inter-gate insulator film disposed between the second floating gate and the second control gate, and a sidewall gate electrically connected to the second floating gate and the second control gate.

17 Claims, 30 Drawing Sheets

NONVOLATILE SEMICONDUCTOR MEMORY AND A FABRICATION METHOD FOR THE SAME

CROSS REFERENCE TO RELATED APPLICATIONS

This application is a continuation application of U.S. application Ser. No. 10/971,161, filed Oct. 25, 2004 and based upon and claims the benefit of priority from prior Japanese Patent Application P2004-067712 filed on Mar. 10, 2004; the entire contents of each of which are incorporated by reference herein.

BACKGROUND OF THE INVENTION

1. Field of the Invention

The present invention relates to electrically erasable programmable read-only nonvolatile semiconductor memory (EEPROM).

2. Description of the Related Art

Conventionally, an electrically erasable programmable read-only memory (EEPROM), which electrically performs data write-in and erasure, for example, has been known as a nonvolatile semiconductor memory (Non Patent Reference 1: R. Shirota, 'A Review of 256-Mbit NAND Flash Memories and NAND Flash Future Trend', Non-Volatile Semiconductor Memory Workshop (NVSMW) 2000, p. 0.22-31). In this EEPROM, especially a NAND type, a memory cell array is configured by disposing memory cells at the respective intersections of horizontal word lines and vertical bit lines. A MOS transistor having a 'stacked gate structure' configured by stacking a floating gate (FG) and a control gate (CG), for example, is typically used as a memory cell.

There are a number of conventional methods for forming the gate electrode of a select gate transistor such as electrically connecting a floating gate and a control gate by etching a part of the inter-gate insulating film of the select gate transistor. However, with any of these methods, as miniaturization progresses, processing becomes difficult when the floating gate is particularly a thin film.

SUMMARY OF THE INVENTION

A first aspect of the present invention inheres in a nonvolatile semiconductor memory including: a plurality of memory cell transistors, configured with a first floating gate, a first control gate, and a first inter-gate insulating film disposed between the first floating gate and the first control gate, respectively, and aligned along a bit line direction; device isolating regions disposed at a constant pitch along a word line direction making a striped pattern along the bit line direction; and select gate transistors, disposed at each end of the alignment of the plurality of memory cell transistors, each of the select gate transistors configured with a second floating gate, a second control gate, a second inter-gate insulator film disposed between the second floating gate and the second control gate, and a sidewall gate electrically connected to the second floating gate and the second control gate.

A second aspect of the present invention inheres in a fabrication method for a nonvolatile semiconductor memory including: forming a polysilicon layer for floating gates, and then forming an etching trench for device isolating region formation by selectively removing the polysilicon layer for the floating gates; forming a device isolating region by depositing an insulator film across the entire surface of the device for filling in the etching trench, and then planarizing until exposing the polysilicon layer for floating gates; successively depositing an inter-gate insulating film, a control gate, and a mask insulator film across the entire planarized surface; successively removing select gate transistors in an area other than a memory cell transistor area, the mask insulator in a peripheral transistor area, the control gate, and the inter-gate insulator film, and then etching the filling material of the device isolating region such that the surface of the device isolating region can be at a lower position than the bottom of the inter-gate insulator film; depositing a conductive material for sidewall gates across the entire surface of the device, and then selectively etching to leave only sidewall gates; and forming isolated memory cell transistor areas and select gate transistor areas.

A third aspect of the present invention inheres in a fabrication method for nonvolatile semiconductor memory including: forming a polysilicon layer for floating gates, and then forming an etching trench for device isolating region formation by selectively removing the polysilicon layer for floating gates; forming a device isolating region by depositing an insulator film across the entirety for filling in the etching trench, and then planarizing until exposing the polysilicon layer for the floating gates; successively depositing an inter-gate insulating film, a control gate, and a mask insulator film across the entire planarized surface; successively removing select gate transistors in an area other than a memory cell transistor area, the mask insulator in a peripheral transistor area, the control gate, and the inter-gate insulator film, and then etching the filling material of the device isolating region such that the surface of the device isolating region is at a lower position than the bottom of the inter-gate insulator film; depositing a conductive material for sidewall gates, and then etching until exposing the surface of the mask insulator film, and stopping the etching process at the top of the floating gates so as to form sidewall gates; and forming isolated memory cell transistor areas and select gate transistor areas.

DETAILED DESCRIPTION OF THE INVENTION

Figure 1:
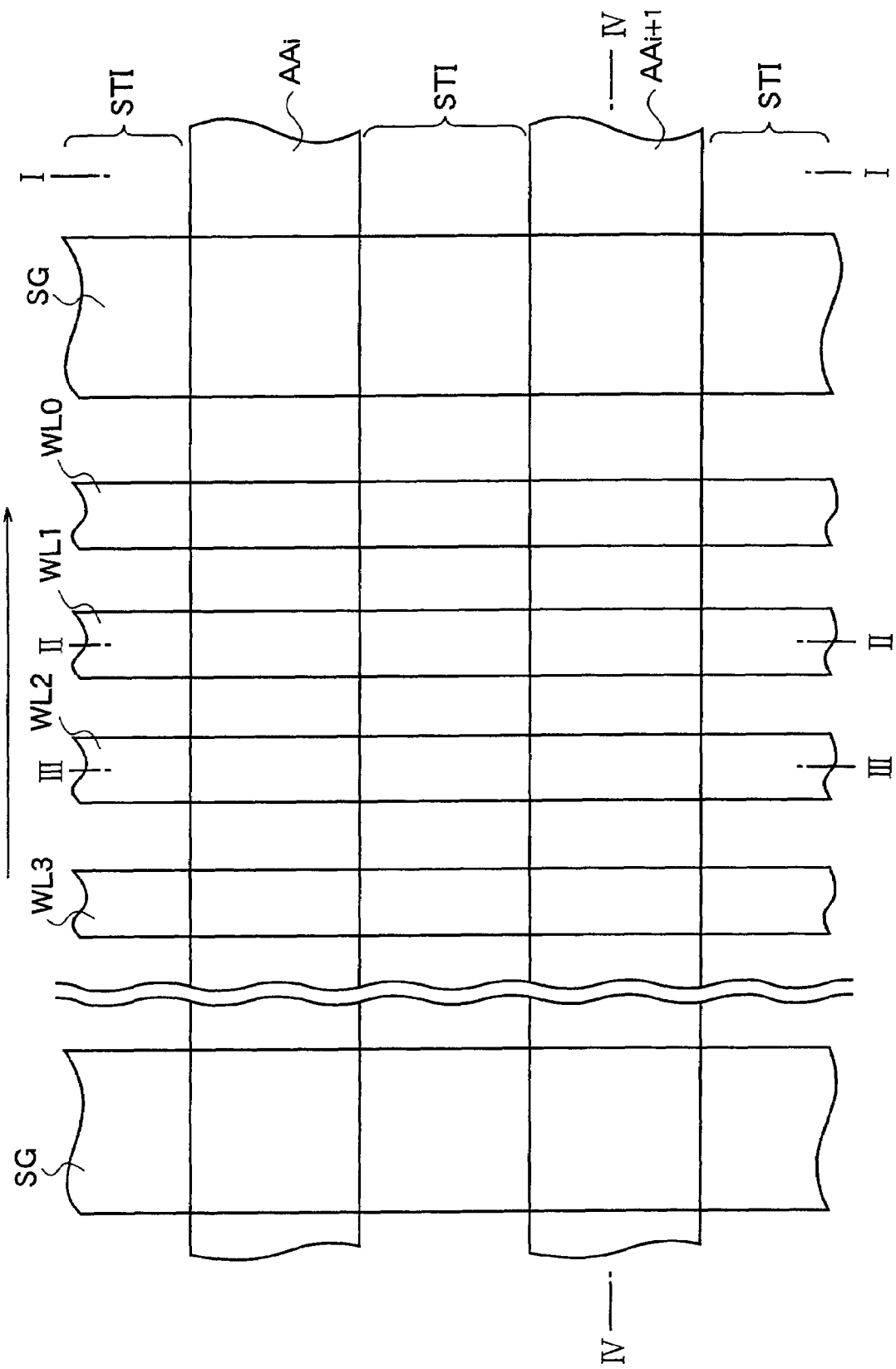
FIG. 1 is a schematic aerial pattern diagram of a NAND nonvolatile semiconductor memory according to a comparative example of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of the circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

Embodiments of the present invention are described forthwith while referencing the drawings. The same or similar symbols are applied to the same or similar parts throughout the appended drawings. In addition, the embodiments given forthwith illustrate devices and methods for embodying the technical idea of the present invention, and that technical idea of the present invention is not limited to the following. The technical idea of the present invention may be modified into various modifications within the scope of the appended claims.

The nonvolatile semiconductor memory according to the embodiments of the present invention eliminates difficulties encountered during the fabrication process provides, precise fabrication of a minute stacked gate structure of a memory cell transistor region, and permits easy formation of connection between the floating gate and the control gate of each peripheral select gate transistor via a sidewall, as well as increase in select gate direction and control of cut-off characteristics even when a floating gate layer is thin or in addition, when a film such as an alumina film, which is difficult to be dry etched, is used as an inter-gate insulating film.

COMPARATIVE EXAMPLE

In a schematic top plan view pattern diagram of a nonvolatile semiconductor memory with a NAND-type EEPROM structure as a comparative example of the present invention, as shown in FIG. 1, memory cell transistors with a stacked gate structure are disposed in active regions $AA_i$ and $AA_{i+1}$ sandwiched between device isolating regions such as shallow trench isolations (STIs). The serially connected memory cell transistors have select gate transistors each connected to a select gate line SG disposed at the ends of a NAND memory cell unit. In addition, the control gate of each memory cell transistor is connected to a corresponding one of word lines WL0, WL1, WL2, WL3, . . . .

Figure 2:
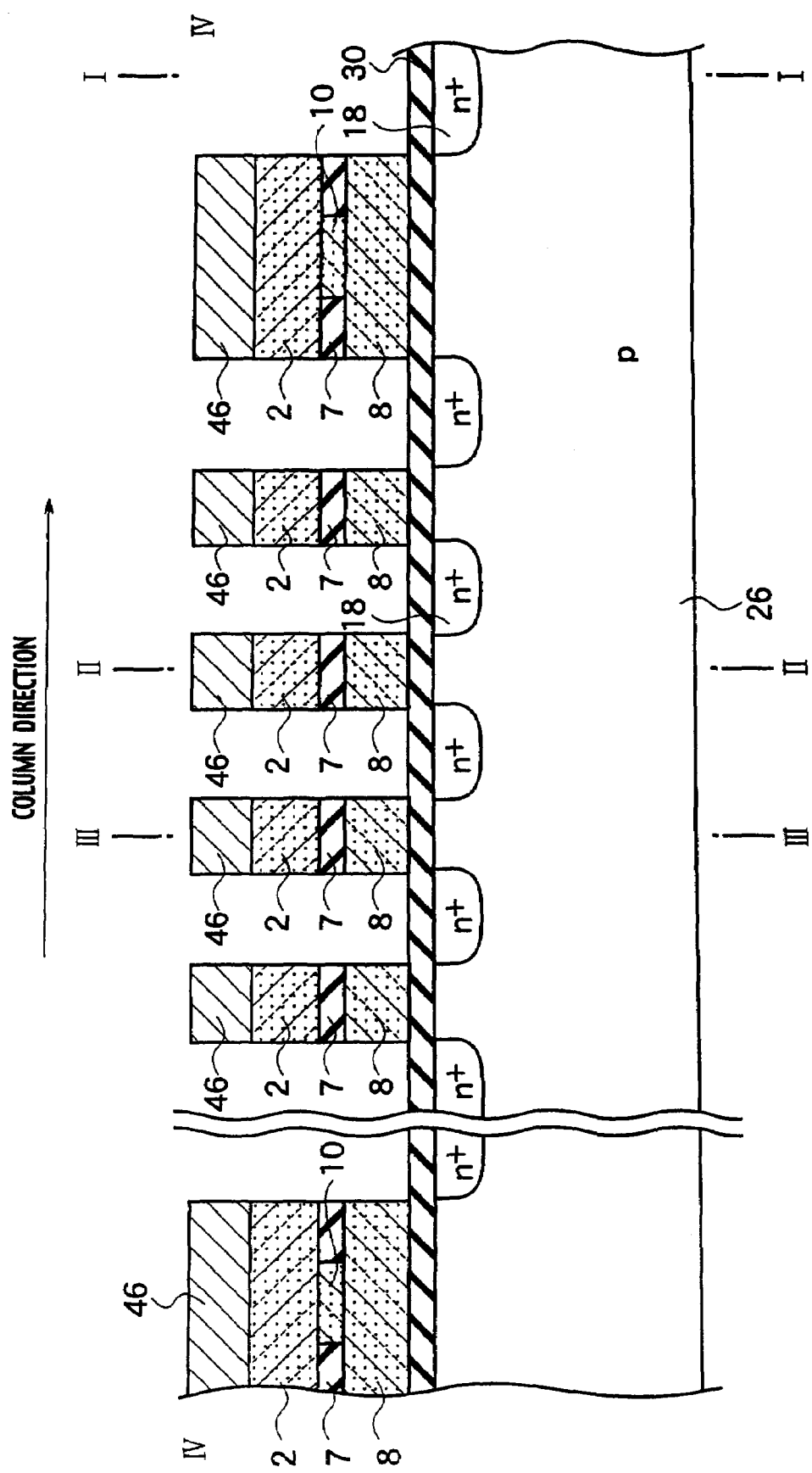
FIG. 2 is a schematic device cross-sectional diagram cut along the line IV-IV of FIG. 1.

FIG. 2, which is a schematic device cross-sectional structure cut along the line IV-IV of FIG. 1, shows memory cell transistor areas and select gate transistor areas of a NAND-type serial structure. In the top plan view pattern diagram of FIG. 1, the lines I-I, II-II, and III-III correspond to the lines I-I, II-II, and III-III in FIG. 2, respectively.

Each NAND-type memory cell transistor area includes diffusion layers 18 formed in a p-well region or a semiconductor substrate 26, a gate insulator film 30, which acts as a tunneling insulator film, formed on the p-well or the semiconductor substrate 26, a floating gate 8, which is disposed on the gate insulator film 30, a control gate 2, which is disposed on the floating gate 8 via an inter-gate insulator film 7 such as an alumina film, and a salicide film 46, which is disposed on the control gate 2.

Each select gate transistor area includes diffusion layers 18 formed in a p-well region or a semiconductor substrate 26, a gate insulator film 30 formed on the p-well or the semiconductor substrate 26, a floating gate 8, which is disposed on the gate insulator film 30, a control gate 2, which is disposed on the floating gate 8 via a polysilicon contact 10 formed in an inter-gate insulator film 7, and a salicide film 46, which is disposed on the control gate 2. In other words, in the select gate transistor area, the floating gate 8 and the control gate 2 are short-circuited via the polysilicon contact 10.

Conventional formation methods for the gate electrode of the select gate transistor of the comparative example, include methods of providing a conducting connection between the floating gates 8 and the control gates 2 by removing, through etching, a part of the gate electrodes 7 of the select gate transistor. However, with any of the conventional methods, as miniaturization continues, processing becomes difficult when the floating gate 8 is particularly a thin film.

FIRST EMBODIMENT

Figure 3:
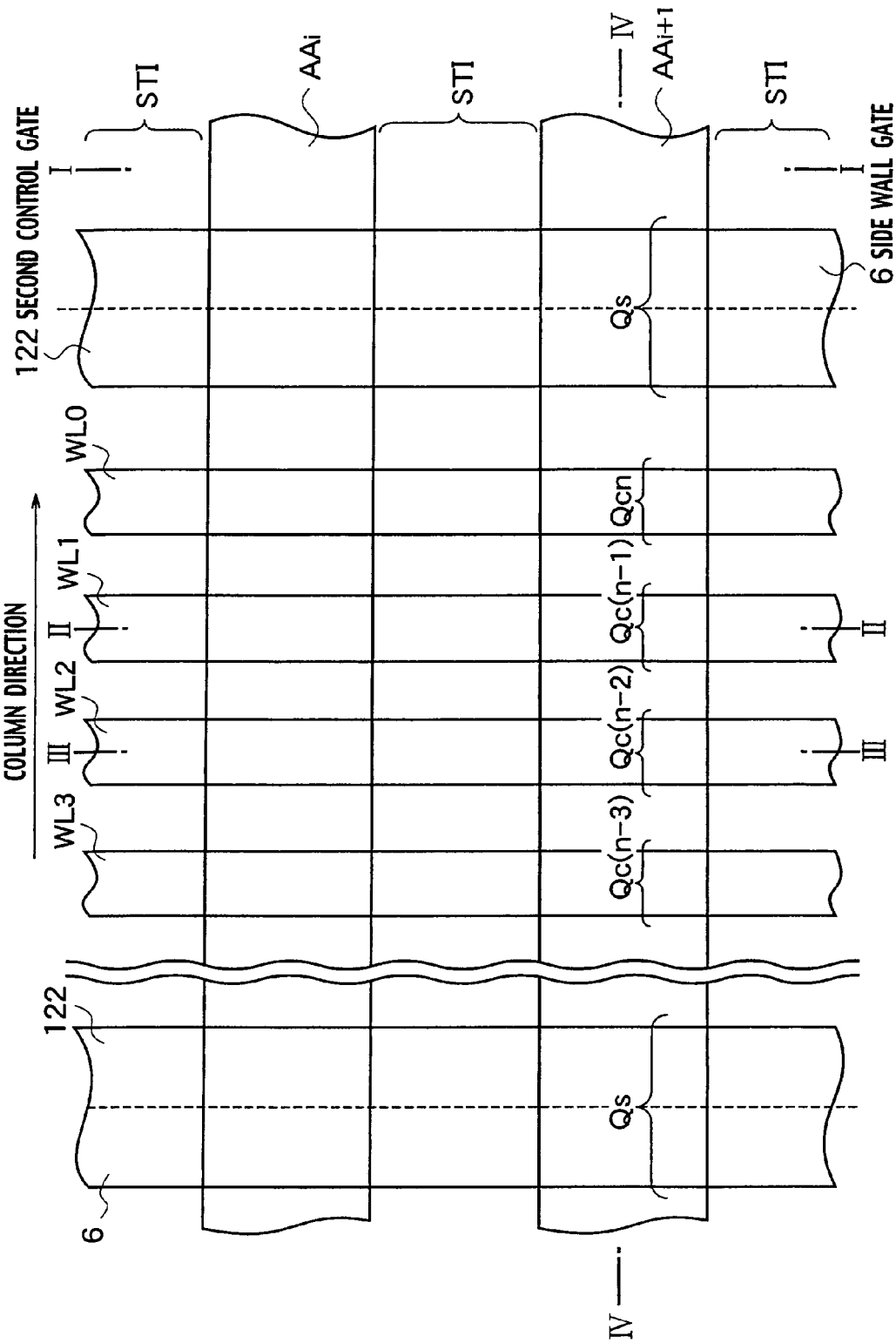
FIG. 3 is a schematic aerial pattern diagram of a nonvolatile semiconductor memory according to a first embodiment of the present invention.
Figure 4:
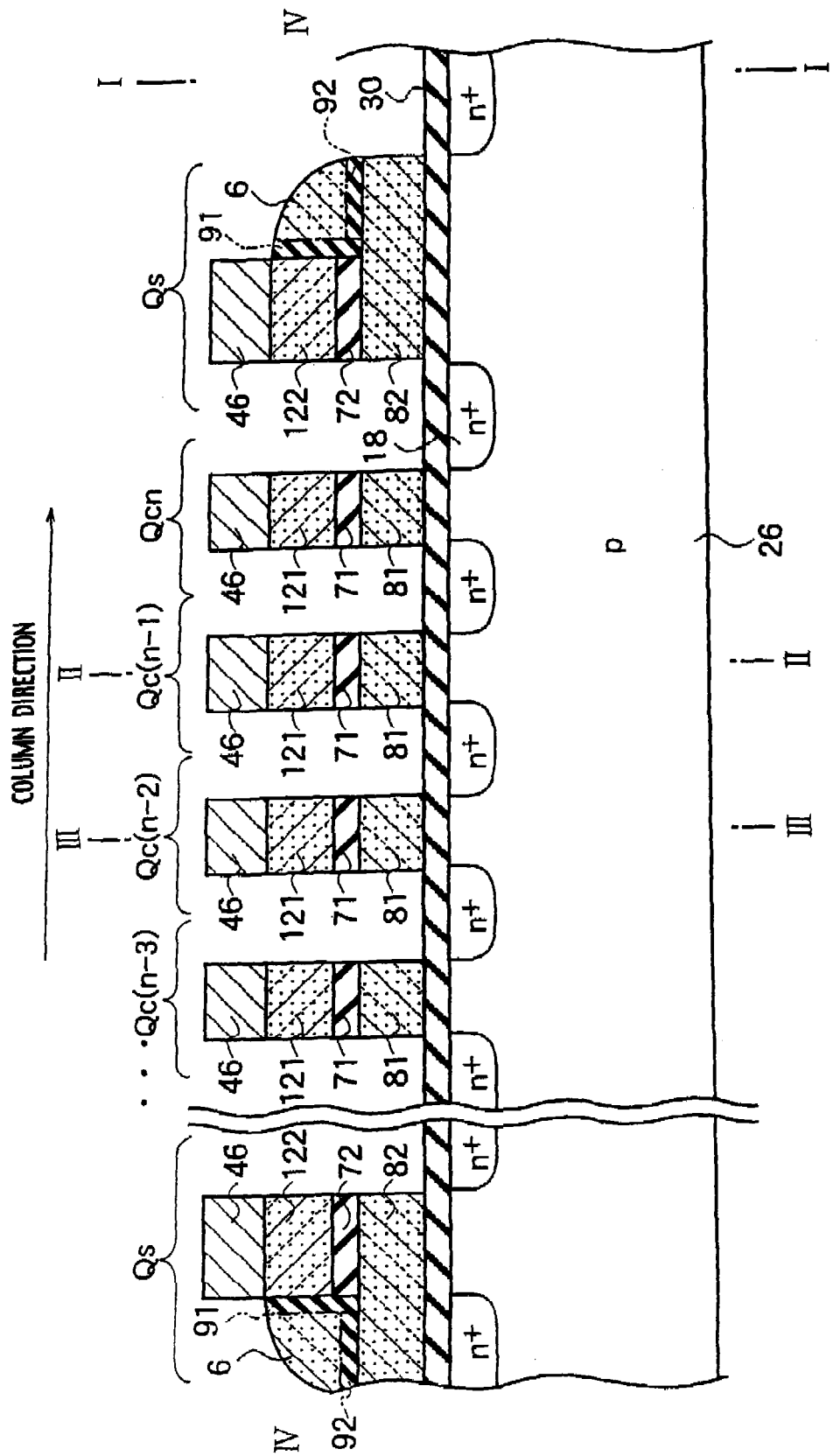
FIG. 4 is a schematic device cross-sectional diagram of the nonvolatile semiconductor memory according to the first embodiment of the present invention.

A schematic device cross-sectional structure of a nonvolatile semiconductor device according to a first embodiment of the present invention, as shown in FIG. 4, corresponds to a schematic device cross-sectional structure cut along the line IV-IV in a schematic top plan view pattern diagram of FIG. 3.

The nonvolatile semiconductor device according to the first embodiment of the present invention, as shown in FIGS. 3 and 4, includes memory cell transistors $Q_{cn}$, $Q_{c(n-1)}$, $Q_{c(n-2)}$, . . . aligned along the bit line BL direction, each of the memory cell transistors has a first floating gate 81, a first control gate 121, and a first inter-gate insulator film 71 disposed between the first floating gate 81 and the first control gate 121; device isolating regions STI, disposed at a constant pitch along the direction of word lines WL0, WL1, WL2, WL3, . . . so as to form a striped pattern along the bit line BL direction; and select gate transistors $Q_s$, each having a second floating gate 82, a second control gate 122, a second inter-gate insulator film 72 disposed between the second floating gate 82 and the second control gate 122, and a sidewall gate 6 electrically connected to the second floating gate 82 and the second control gate 122.

In addition, the memory cell transistors $Q_{cn}$, $Q_{c(n-1)}$, $Q_{c(n-2)}$, . . . and select gate transistors $Q_s$ in the examples of FIGS. 3 and 4 are formed on the p-well region or the semiconductor substrate 26 and include the gate insulator film 30 and the diffusion layers 18, respectively. The diffusion layers 18 of the memory cell transistors $Q_{cn}$, $Q_{c(n-1)}$, $Q_{c(n-2)}$, $Q_{c(n-3)}$, . . . are source and drain regions connected in series thereto, and represent source and drain regions for the select gate transistors $Q_s$ at respective arrayed ends of the multiple memory cell transistors $Q_{cn}$, $Q_{c(n-1)}$, $Q_{c(n-2)}$, $Q_{c(n-3)}$, . . . .

The sidewall gates 6 are disposed on one respective sidewall of the second inter-gate insulator films 72 and the control gates 122. The sidewall gates 6 are in electrical contact with the second control gates 122. Further, the bottom of the sidewall gates 6 are in electrical contact with the entire or at least a part of the surface of the second floating gates 82. As a result, the second control gates 122 and the second floating gates 82 of the select gate transistors $Q_s$ are electrically short-circuited via the sidewall gates 6.

FIG. 4 schematically shows that first sidewall gate oxide films 91 made of a conductive thin oxide film or an oxide are formed on the interface between the sidewall gates 6 and the control gates 122. Similarly, second sidewall gate oxide films 92 are made of a conductive thin oxide film or an oxide, are formed on the interface between the sidewall gates 6 and the second floating gates 82. These first sidewall gate oxide films 91 and second sidewall gate oxide films 92 may be formed as natural oxide films, and may be in an island shape.

Such first sidewall gate oxide films 91 and second sidewall gate oxide films 92 are thin natural oxide films, which are formed at the time of deposition and formation of the second floating gates 82, the second control gates 122, and the sidewall gates 6 at different times during the fabrication process.

Furthermore, such first sidewall gate oxide films 91 and second sidewall gate oxide films 92 are made of a conductive thin oxide film or a conductive oxide, and do not influence contact characteristics between the sidewall gates 6 and the second control gates 122, or between the sidewall gates 6 and the second floating gates 82. With the following description of the fabrication method, description of the first sidewall gate oxide films 91 and second sidewall gate oxide films 92 is omitted as they are natural oxide films or oxides.

The widths of the first inter-gate insulator films 71 and the second inter-gate insulator films 72 arranged along the bit line BL direction (column direction) shown in FIG. 4 need not be equal. For favorable cut-off characteristics of the select gate transistors $Q_s$, the width of the second inter-gate insulator films 72 should be formed wider than that of the first inter-gate insulator films 71.

The first floating gates 81, the first inter-gate insulator films 71, and the first control gates 121, which represent the structure of the memory cell transistors $Q_{cn}$, $Q_{c(n-1)}$, $Q_{c(n-2)}$, $Q_{c(n-3)}$, . . . , correspond to the second floating gates 82, the second inter-gate insulator films 72, and the second control gates 122, which represent the structure of each select gate transistor $Q_s$ and are made of the same material as they are formed simultaneously during the fabrication process.

Furthermore, with the example of FIG. 4, salicide films 46 are respectively disposed on the first control gates 121 and the second control gates 122. The salicide films 46 are effective in reducing the resistance of the first control gates 121 and the second control gates 122. Note that a simpler structure without forming the salicide films 46 may be employed.

(Fabrication Method)

Figure 5:
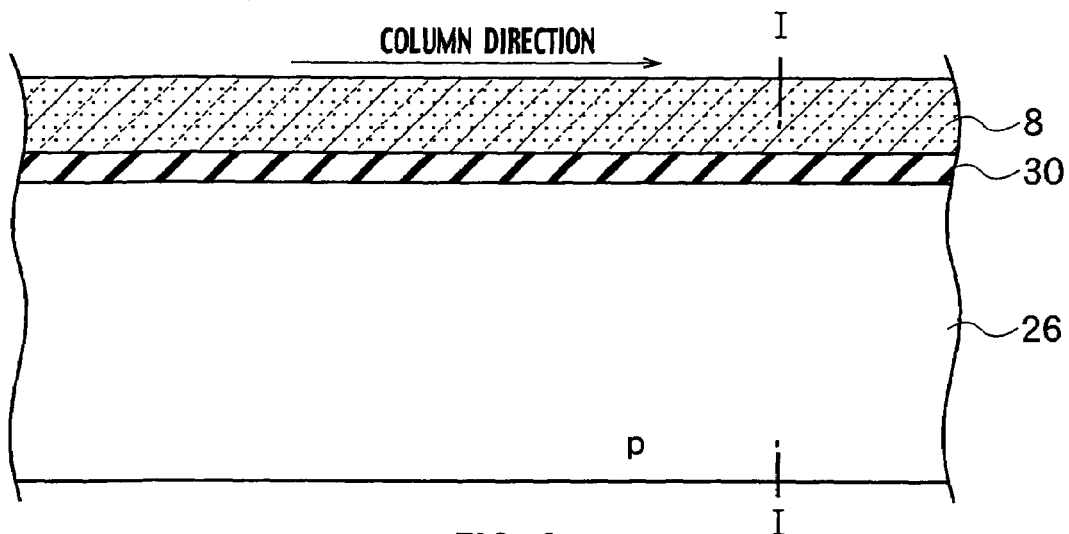
FIG. 5 is a schematic device cross-sectional diagram illustrating a step of a nonvolatile semiconductor memory fabrication method according to the first embodiment of the present invention.

To begin with, as shown in FIG. 5, after gate oxidation so as to form the gate insulating film (tunnel oxide film) 30 for a memory cell transistor or a select gate transistor, floating gates 8 are formed on the p-well region or the semiconductor substrate 26. The floating gates 8 may be made of a polysilicon layer, for example.

Note that subsequently, an insulator film, which can be utilized as a stopper film during chemical mechanical polishing, may be deposited on the floating gates 8.

Figure 6:
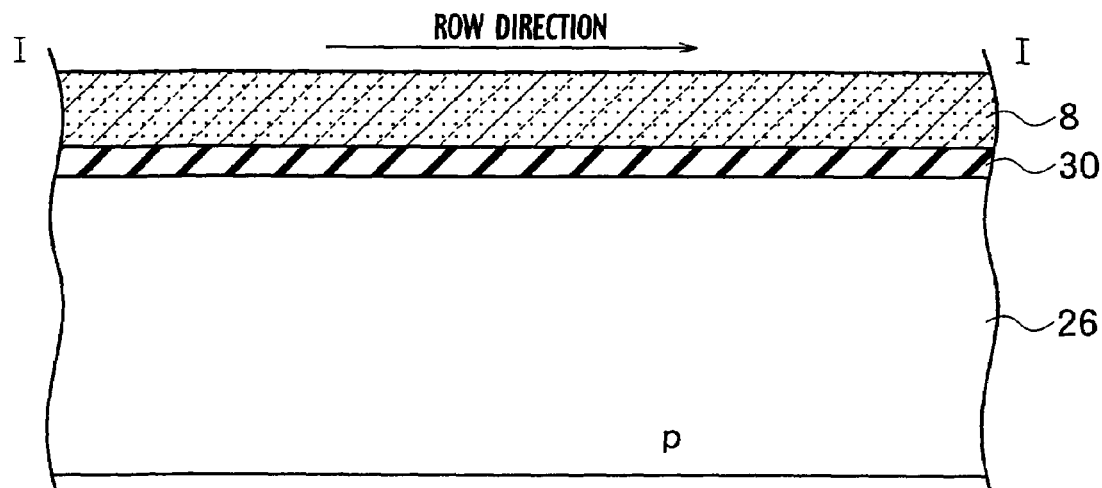
FIG. 6 is a schematic device cross-sectional diagram cut along the line I-I of FIG. 5.

The schematic device cross-sectional diagram cut along the line I-I of FIG. 5, as shown in FIG. 6, includes the p-well or the semiconductor substrate 26 as in FIG. 5, the gate insulating film (tunnel oxide film) 30 for a memory cell transistor or a select gate transistor, and the floating gate 8 comprising a polysilicon layer, for example. The position of the line I-I of FIG. 5 corresponds to the line I-I of FIG. 3, which is a corresponding aerial pattern diagram.

Figure 7:
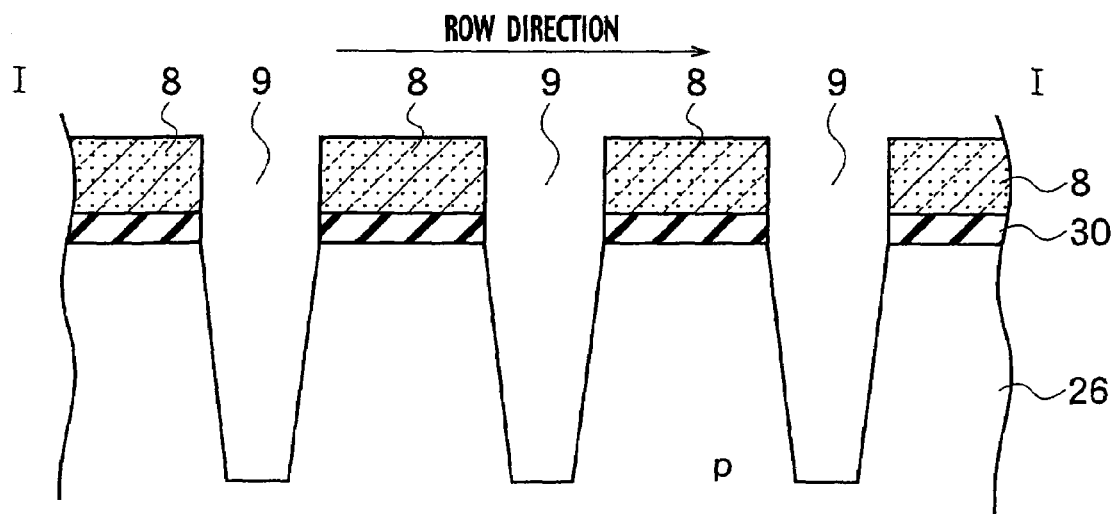
FIG. 7 is a schematic cross-sectional diagram illustrating a step of the nonvolatile semiconductor memory fabrication method according to the first embodiment of the present invention.

Subsequent to the cross-section cut along the line I-I shown in FIG. 6, as shown in FIG. 7, once a resist is applied and patterned, a polysilicon layer, for example, for the floating gates 8 is selectively removed through dry etching such as reactive ion etching (RIE), the gate insulator film 30 is removed, and through further RIE, etching trenches 9 are formed for formation of device isolating regions such as STIs.

Figure 8:
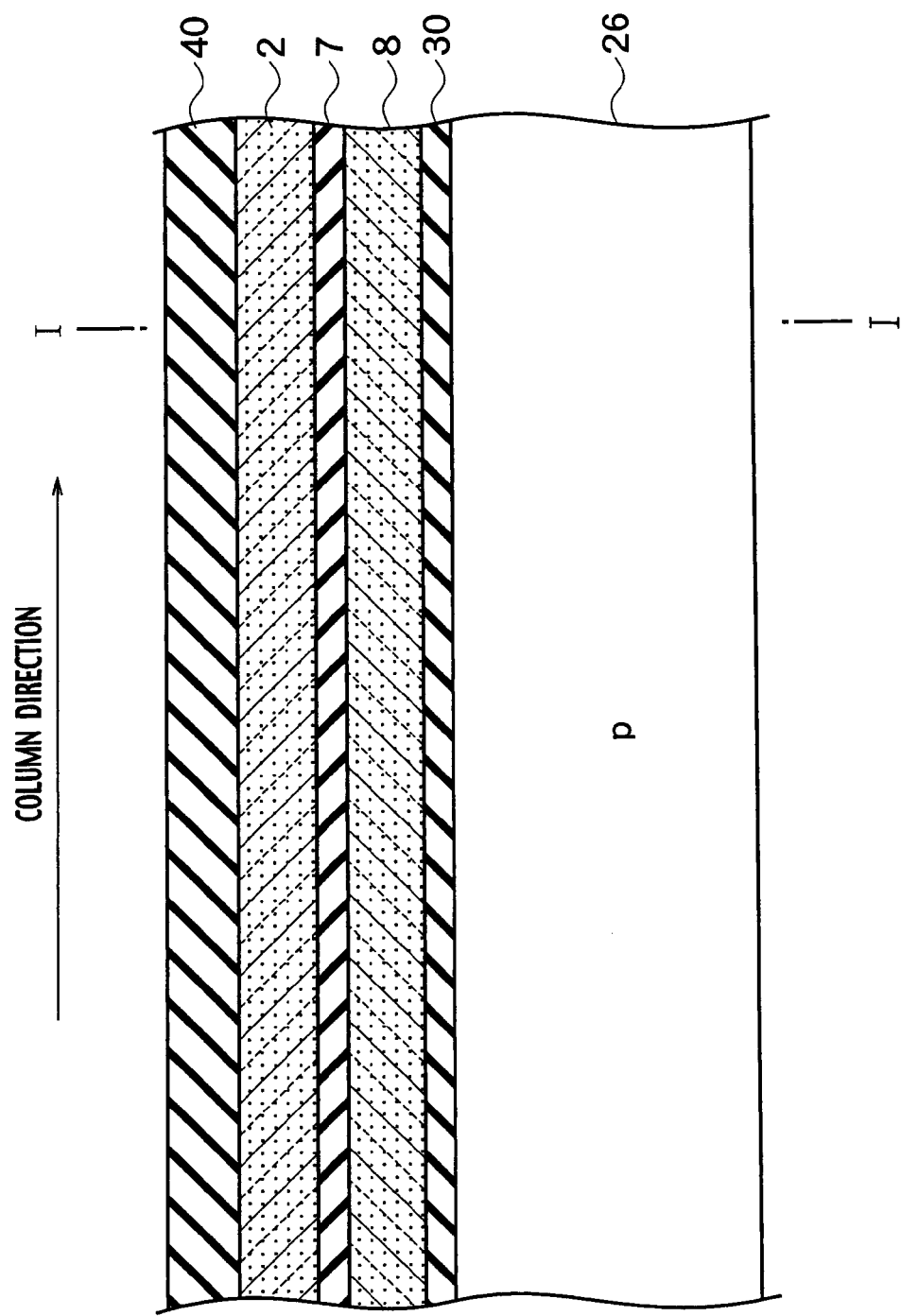
FIG. 8 is a schematic cross-sectional diagram illustrating a step of the nonvolatile semiconductor memory fabrication method according to the first embodiment of the present invention.
Figure 9:
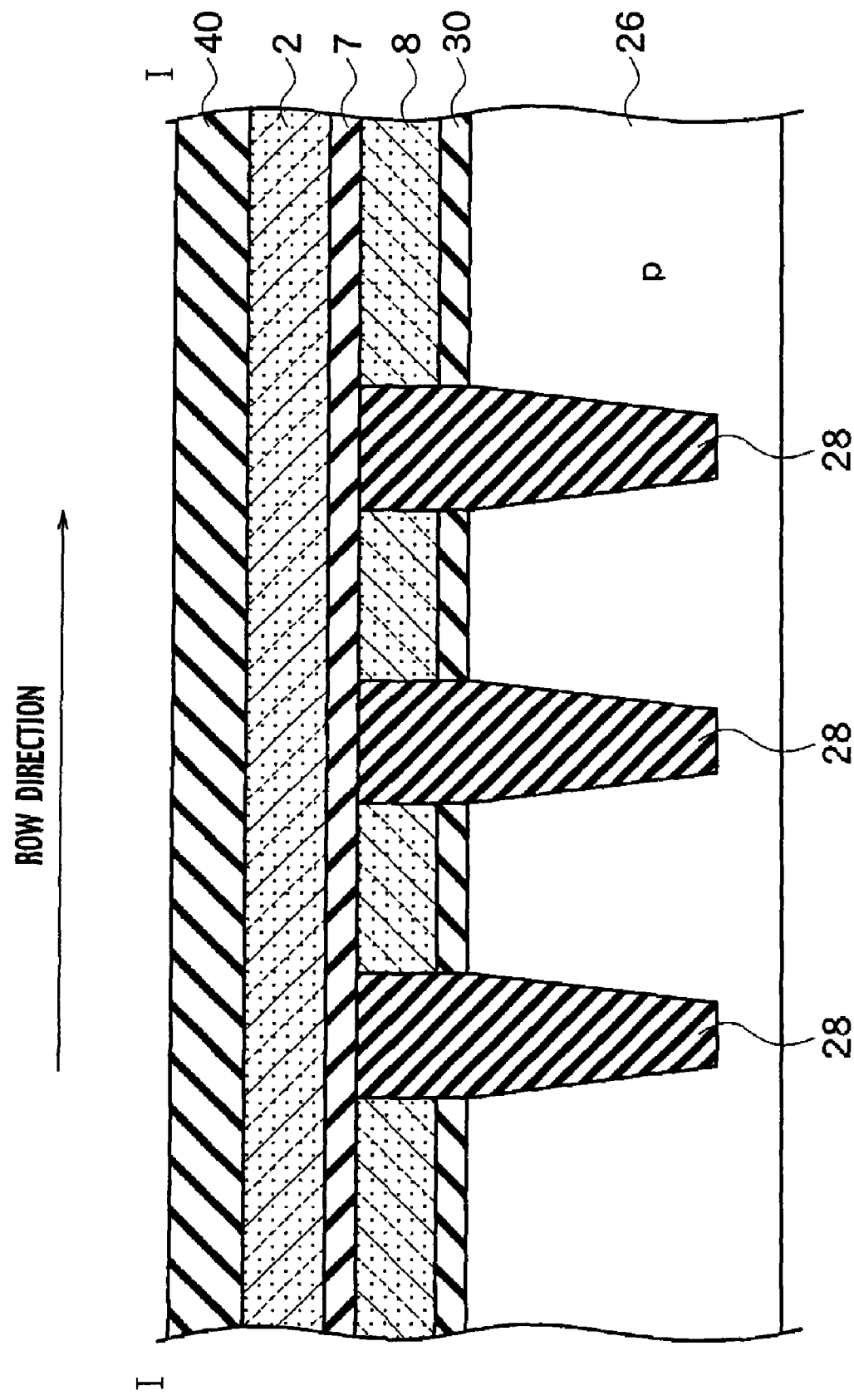
FIG. 9 is a schematic device cross-sectional diagram cut along the line I-I of FIG. 8.

As shown in FIG. 8 and FIG. 9, which illustrates a device cross-section cut along the line I-I of FIG. 8, an insulator film such as a tetraethoxydisilane (TEOS) film, for example, is deposited across the entire surface of the device so as to fill in the etching trenches 9, and using chemical mechanical polishing techniques (CMP), the TEOS film or the like is polished until the polysilicon layer for the floating gates 8 is exposed, forming device isolating regions 28. Furthermore, an inter-gate insulator film 7 such as an alumina film is deposited across the entire polished surface. Polysilicon, for example, is deposited for the control gates 2, and then a mask insulator film 40 is formed. Note that as explained above, an insulator film, which can be utilized as a stopper film during chemical mechanical polishing (CMP), may be deposited on the floating gates 8. In this case, the device surface is not always necessarily polished.

Note that the inter-gate insulating film 7 may have a structure including not only an aluminum oxide such as the alumina film or the like, but a single layer or a multi-layered film made of a hafnium oxide, a silicon oxide, a silicon nitride and/or a zirconium oxide.

Figure 10:
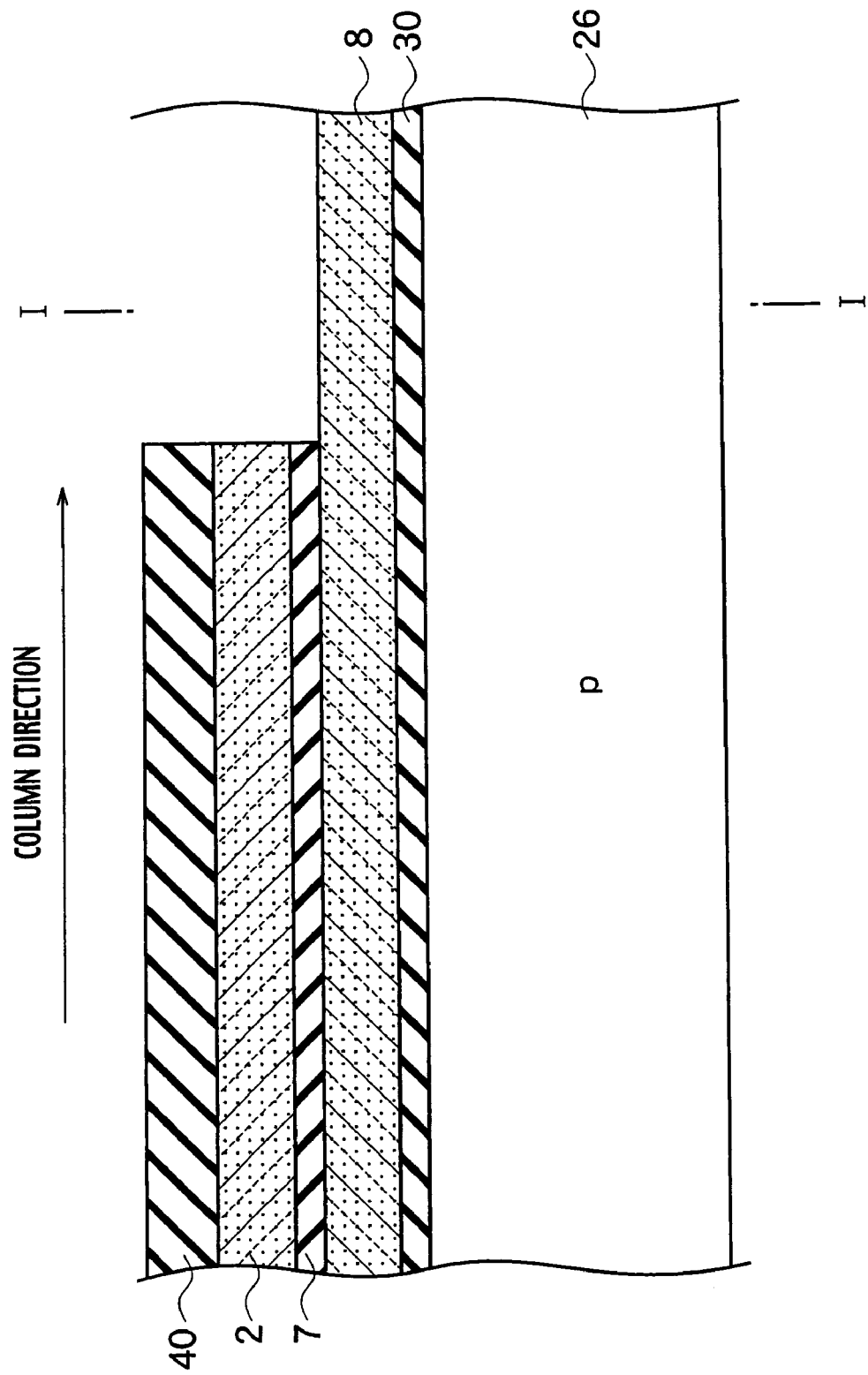
FIG. 10 is a schematic cross-sectional diagram illustrating a step of the nonvolatile semiconductor memory fabrication method according to the first embodiment of the present invention.
Figure 11:
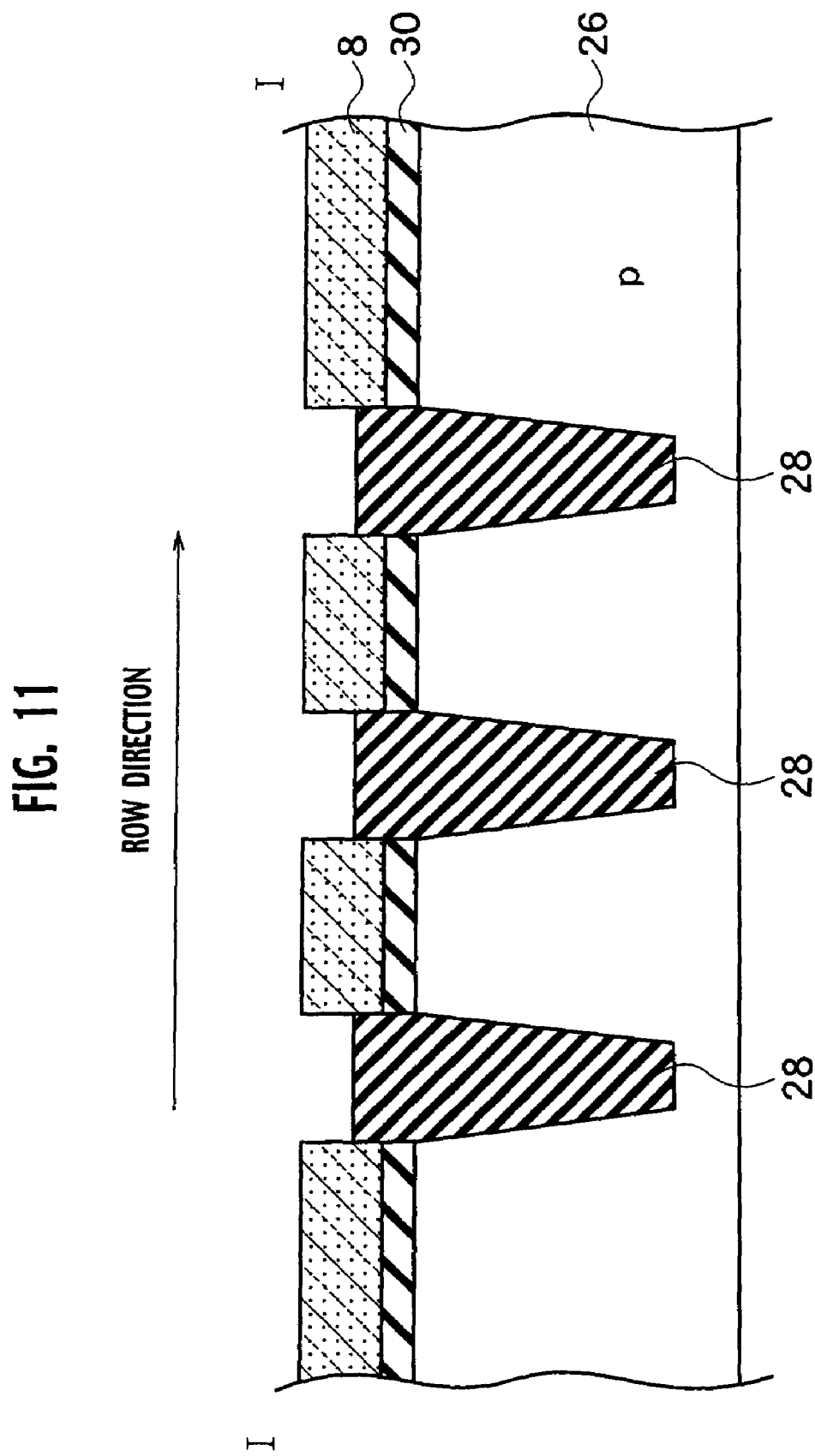
FIG. 11 is a schematic device cross-sectional diagram cut along the line I-I of FIG. 10.

As shown in FIG. 10, the mask insulator film 40, the control gate 2, and the inter-gate insulating film 7 in the peripheral transistor area and the select gate transistor area other than the memory cell transistor area are removed through lithography and etching. Here, as shown in FIG. 11, which is a device cross-sectional structure cut along the line I-I of FIG. 10, the material filled in the device isolating regions 28 is etched such that the top surface of the device isolating regions 28 is lower than the top surface of the floating gates 8 in the etched regions of FIG. 10. Formation of the surface of the device isolating regions 28 at a lower position prevents short circuits between neighboring floating gates 8. As a result, the top surface of the device isolating regions 28 is formed so as to be lower than the bottom of the inter-gate insulator film 7.

Figure 12:
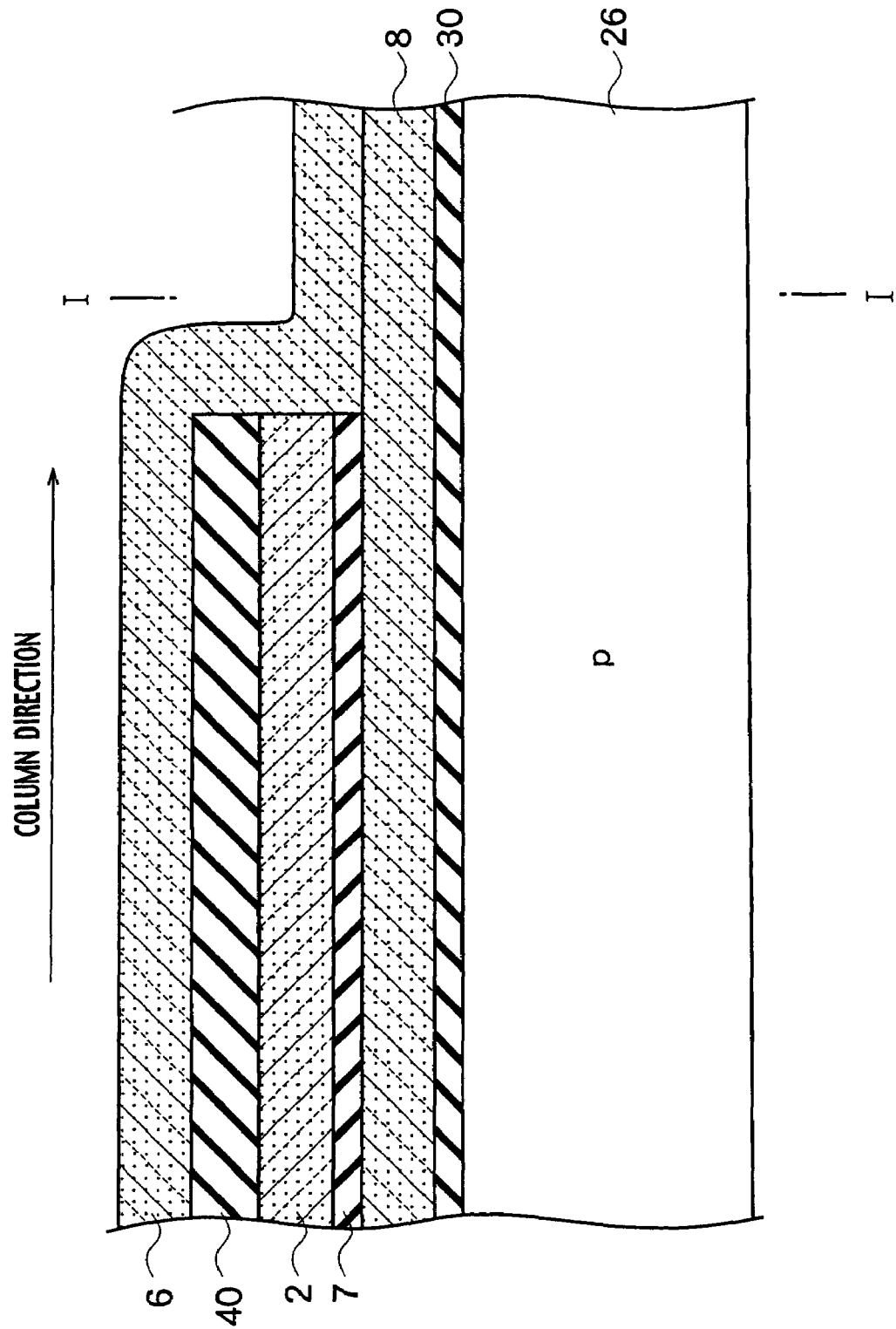
FIG. 12 is a schematic cross-sectional diagram illustrating a step of the nonvolatile semiconductor memory fabrication method according to the first embodiment of the present invention.
Figure 13:
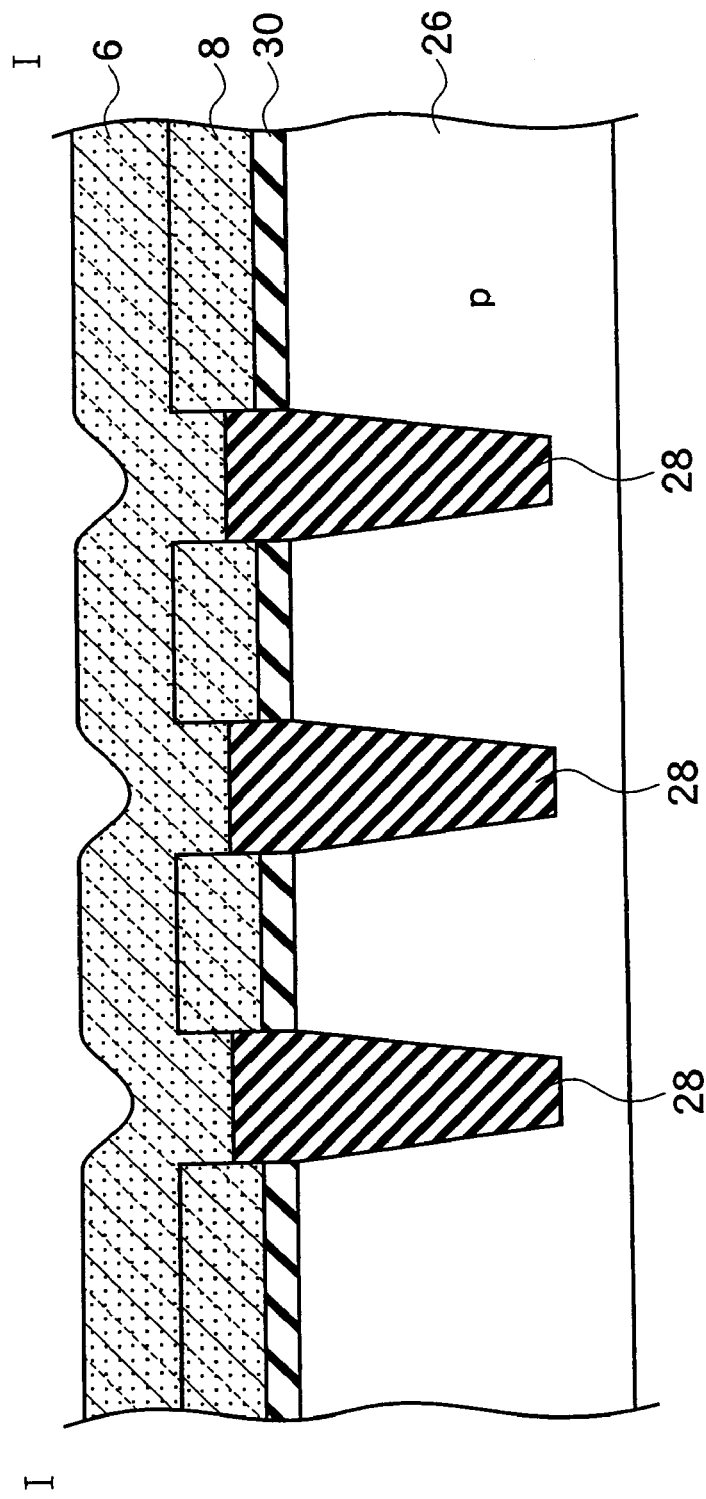
FIG. 13 is a schematic device cross-sectional diagram cut along the line I-I of FIG. 12.

As shown in FIG. 12, a conductive material such as a polysilicon is uniformly deposited across the entire surface of the device for the sidewall gate 6. FIG. 13 shows a schematic device cross-sectional structure cut along the line I-I of FIG. 12, illustrating a conductive material such as a polysilicon being uniformly deposited across the entire surface of the device for the sidewall gate 6.

In this case, compared to the structure of the floating gates 8 and the control gates 2 shown in FIG. 2, for example, electrically connected via the polysilicon contacts 10, a structure with the floating gates 8 and the control gates 2 at the sidewall portions reliably electrically connected via the polysilicon, for the sidewall gates 6 is provided. Thus, as miniaturization progresses, formation of a structure in which connection between the floating gates 8 and the control gates 2 is easier is possible.

Figure 14:
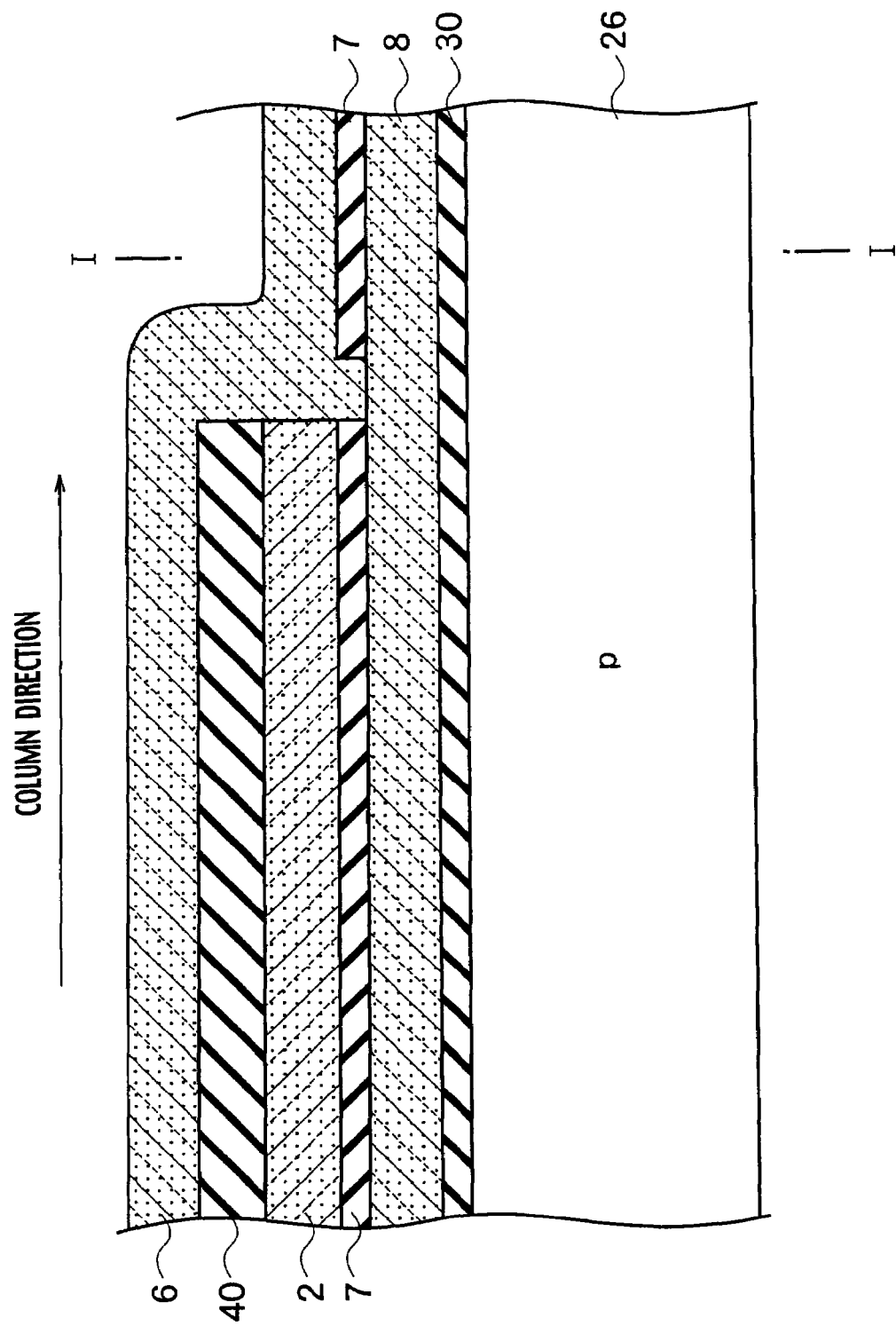
FIG. 14 is a schematic cross-sectional diagram illustrating a modified example of a step of the nonvolatile semiconductor memory fabrication method according to the first embodiment of the present invention.

FIG. 14 is a schematic cross-sectional diagram illustrating a modified example of a step of the nonvolatile semiconductor memory fabrication method according to the first embodiment of the present invention. In the step of FIG. 10, when removing the inter-gate insulator film 7 on the floating gate 8 through lithography and etching, a step of leaving a portion thereof on the floating gate 8, through masking, may be employed. In this case, instead of the structure shown in FIG. 12, the structure has the inter-gate insulator film 7 remaining on a portion of the interface between the sidewall gate 6 and the floating gate 8, as shown in FIG. 14. The final device structure is formed with the second inter-gate insulator film 72 remaining between the sidewall gate 6 and the second floating gate 82.

Figure 15:
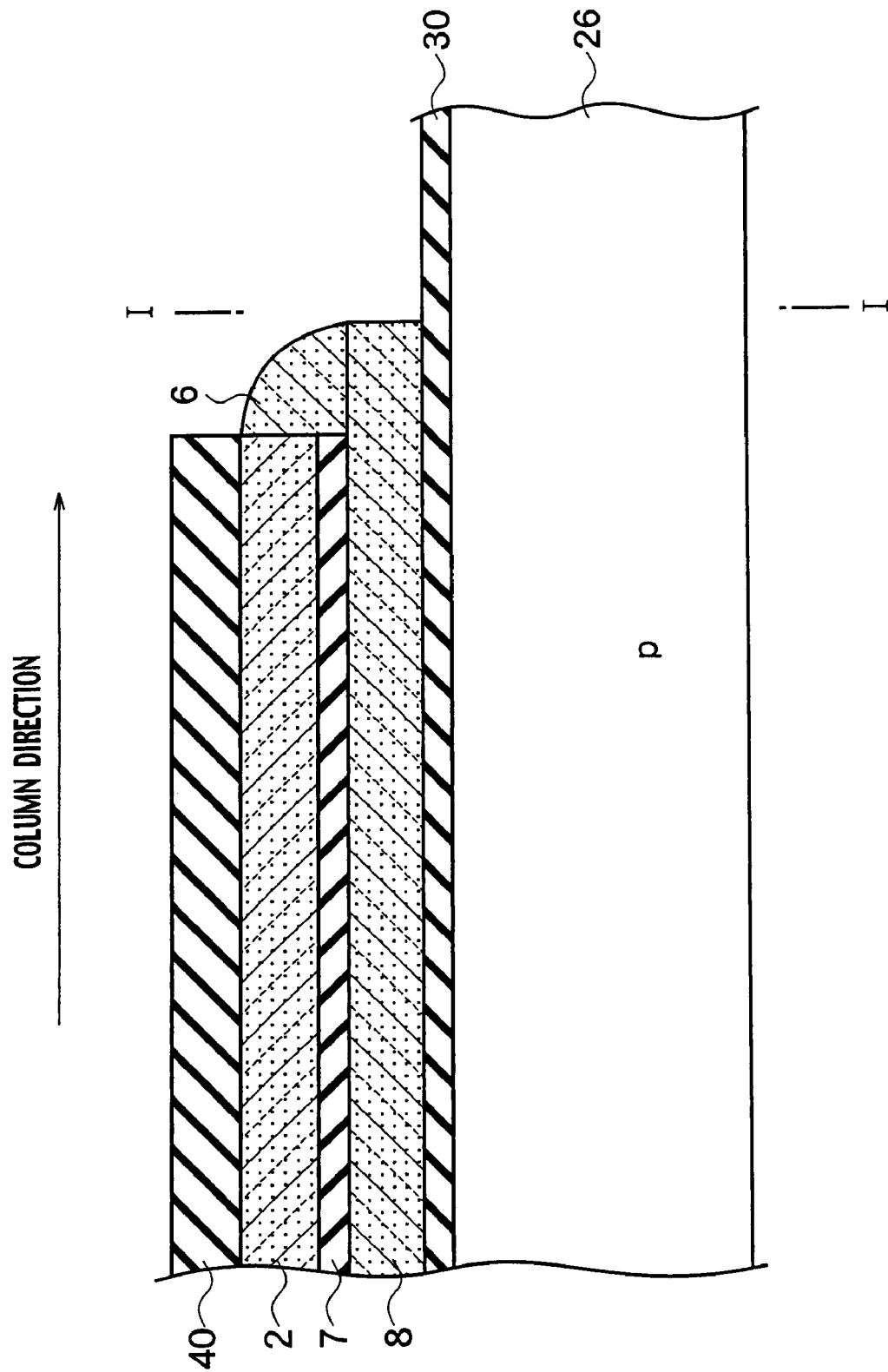
FIG. 15 is a schematic cross-sectional diagram illustrating a step of the nonvolatile semiconductor memory fabrication method according to the first embodiment of the present invention.
Figure 16:
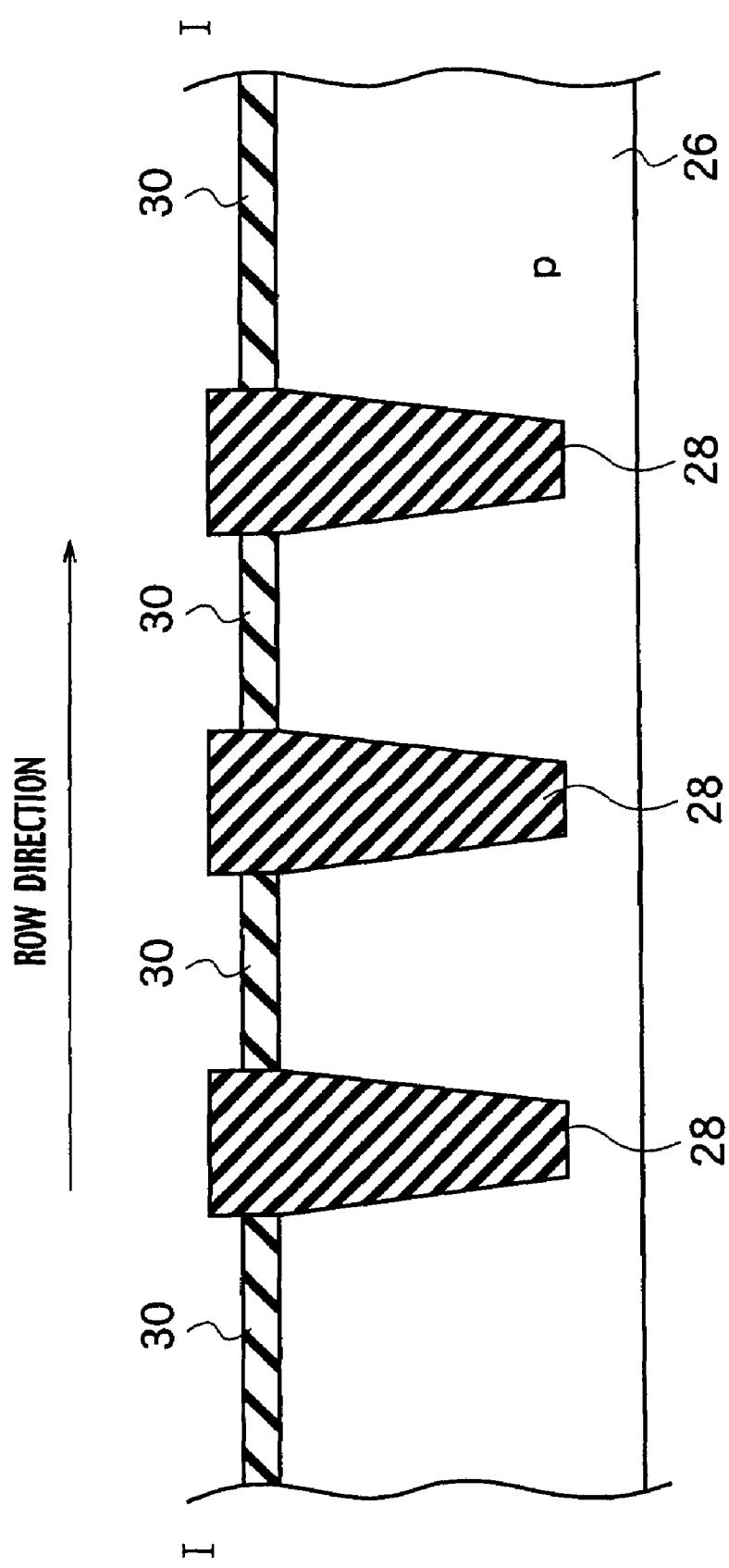
FIG. 16 is a schematic device cross-sectional diagram cut along the line I-I of FIG. 15.

As shown in FIG. 15, the polysilicon for the sidewall gate 6 is etched across the entire surface of the device through anisotropic etching, leaving only the sidewall gate 6. FIG. 16 shows the device cross-sectional structure cut along the line I-I of FIG. 15. As a result, the top surface of the device isolating regions 28 is formed at a position lower than the top surface of the device isolating regions 28 of FIG. 9.

Figure 17:
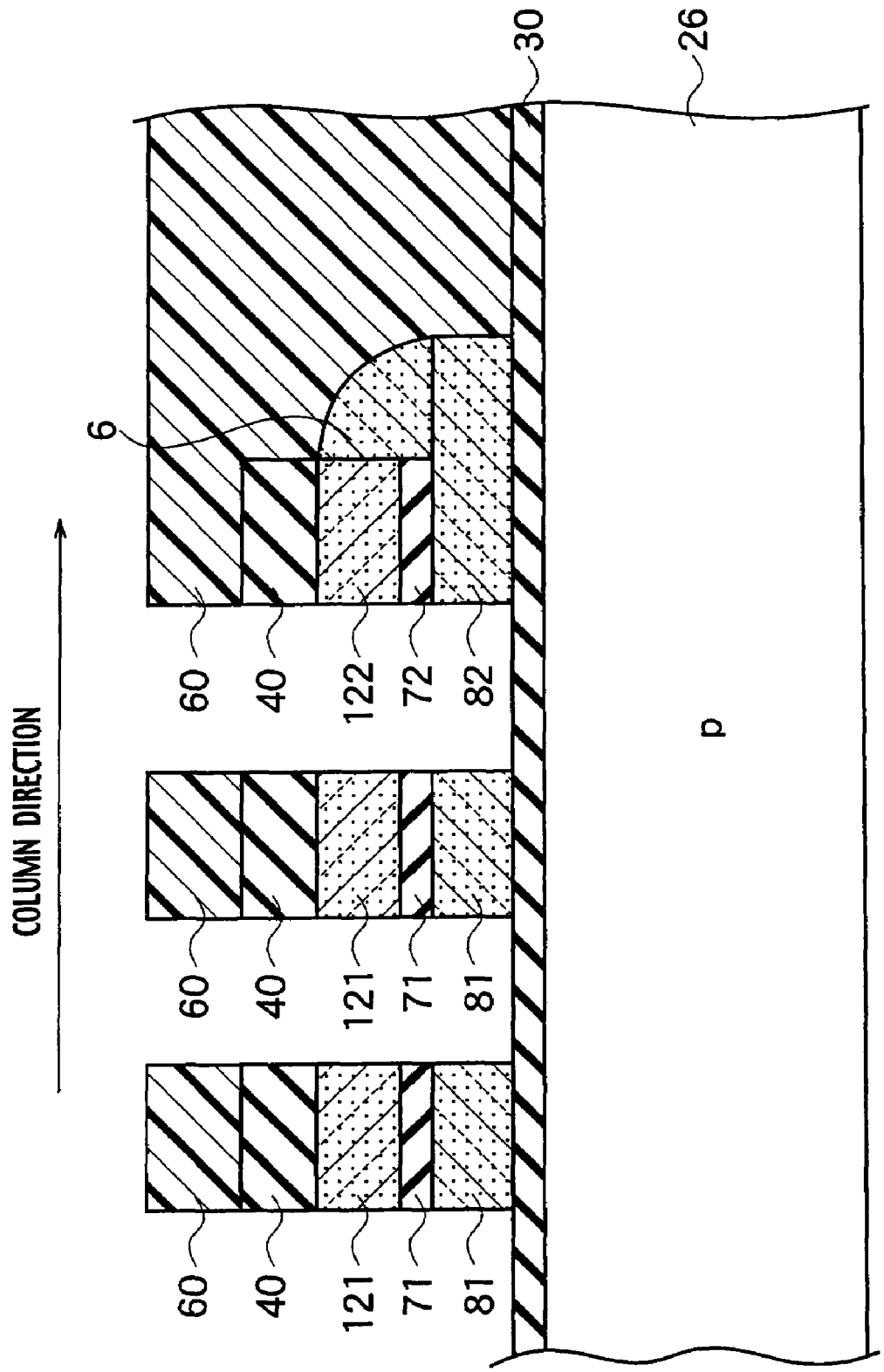
FIG. 17 is a schematic cross-sectional diagram illustrating a step of the nonvolatile semiconductor memory fabrication method according to the first embodiment of the present invention.

As shown in FIG. 17, once the resist 60 is applied across the entire surface of the device, memory cell transistor regions and select gate transistor regions are formed and separated through lithography and etching. As a result, the first floating gates 81 and the second floating gates 82 are formed from the floating gate 8 and separated from each other. The first inter-gate insulator films 71 and the second inter-gate insulator films 72 are formed from the inter-gate insulator film 7 and separated from each other, and the first control gates 121 and the second control gates 122 are formed from the control gate 2 and separated from each other.

Figure 18:
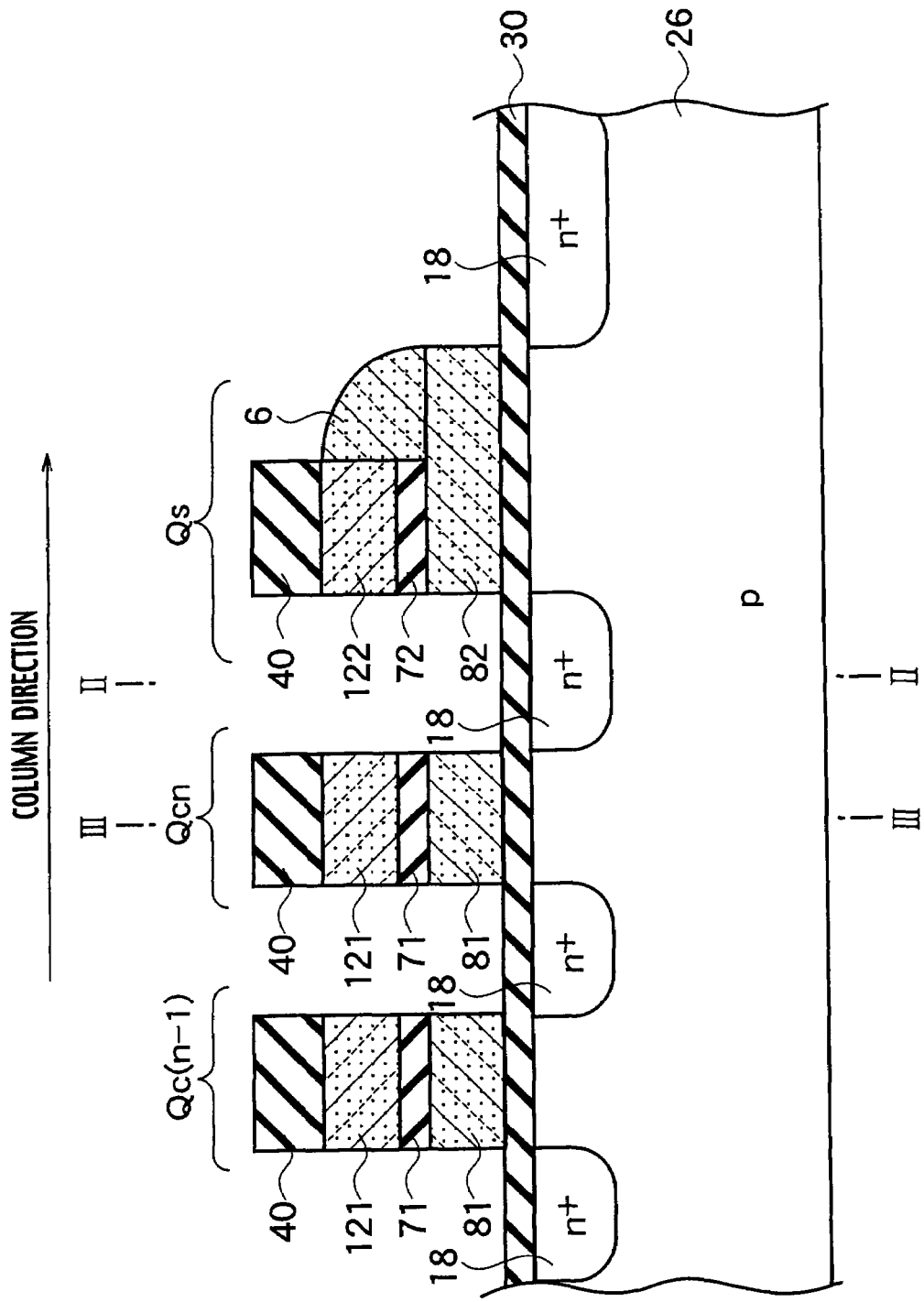
FIG. 18 is a schematic cross-sectional diagram illustrating a step of the nonvolatile semiconductor memory fabrication method according to the first embodiment of the present invention.

As shown in FIG. 18, once the resist 60 is removed, an ion implantation step of implanting ions or an n-type dopant such as phosphorous (P) or arsenic (As) and an annealing step are carried out so as to form n$^+$ diffusion layers 18, which become source and drain regions for the memory cell transistors $Q_{cn}$, $Q_{c(n-1)}$, $Q_{c(n-2)}$, . . . and the select gate transistors $Q_s$.

Figure 20:
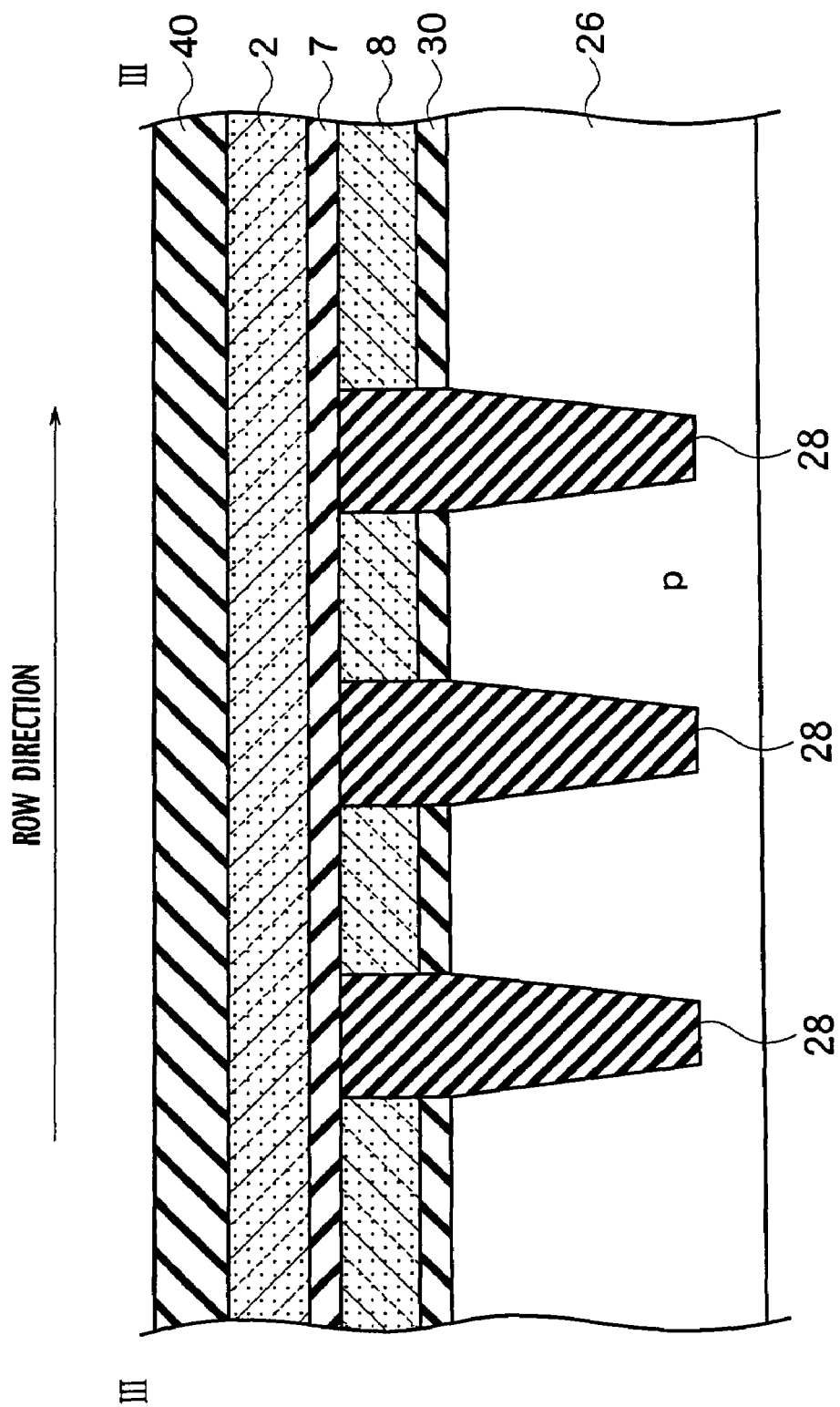
FIG. 20 is a schematic device cross-sectional diagram cut along the line III-III of FIG. 18 or FIG. 19.

FIG. 20 shows a device cross-sectional structure cut along the line III-III of FIG. 18 or in other words, a cross-sectional structure cut along the word line WL direction (row direction). The gate insulator films 30 and the floating gates 8, which are formed on the p-well or the semiconductor substrate 26, are isolated, along the word line WL direction, from each other by the device isolating regions 28. Disposed thereon are the control gate 2 and the mask insulator film 40 via the inter-gate insulator film 7.

Figure 21:
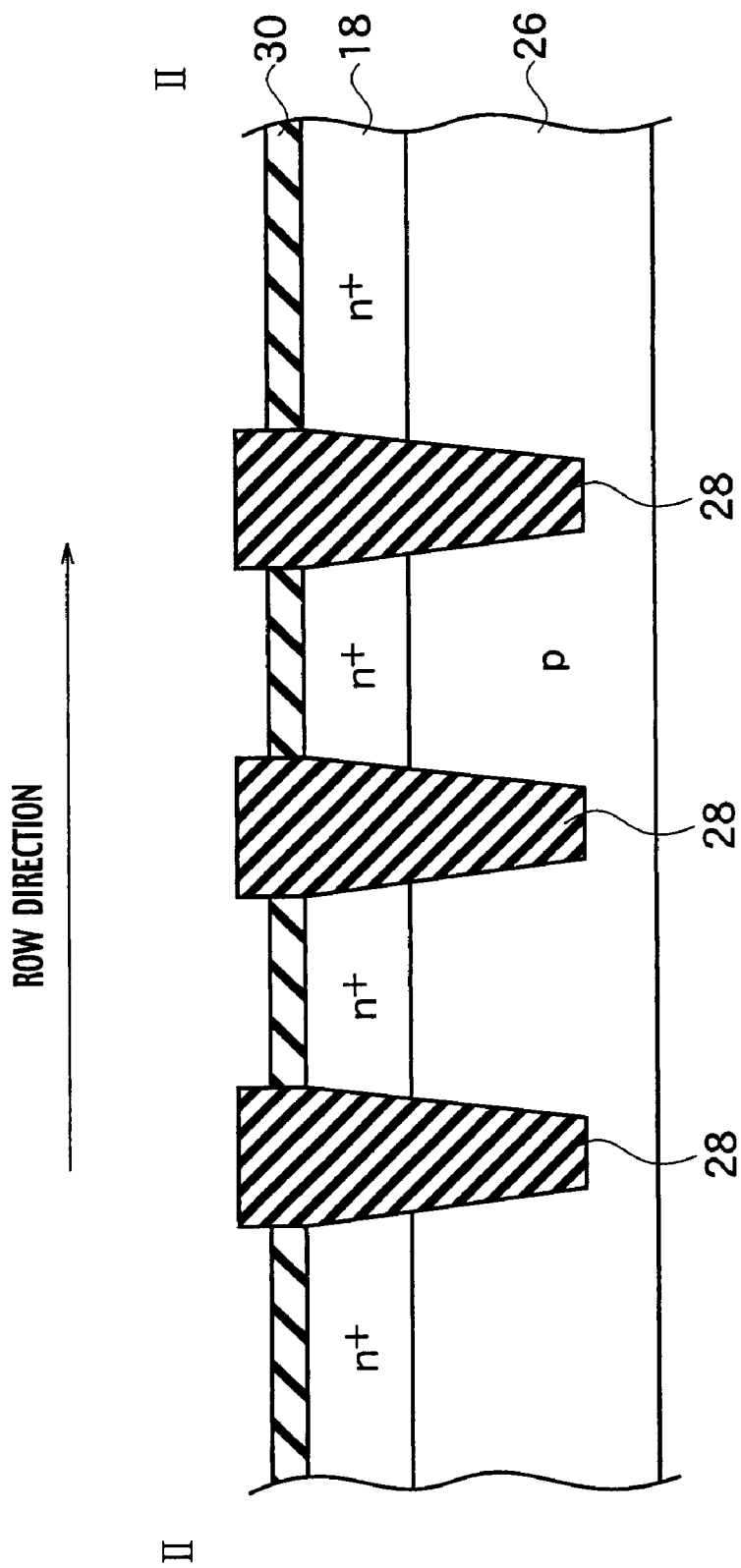
FIG. 21 is a schematic device cross-sectional diagram cut along the line II-II of FIG. 18 or FIG. 19.

FIG. 21 shows a device cross-sectional structure cut along the line II-II of FIG. 18 or in other words, a cross-sectional structure cut along the word line WL direction. The diffusion layers 18 and the gate insulator films 30 formed near the surface of the p-well or the semiconductor substrate 16 are isolated, along the word line WL direction, from each other by the device isolating regions 28. The device isolating regions 28 being formed at a lower position than that in FIG. 20 is the same as in FIG. 13.

Figure 22:
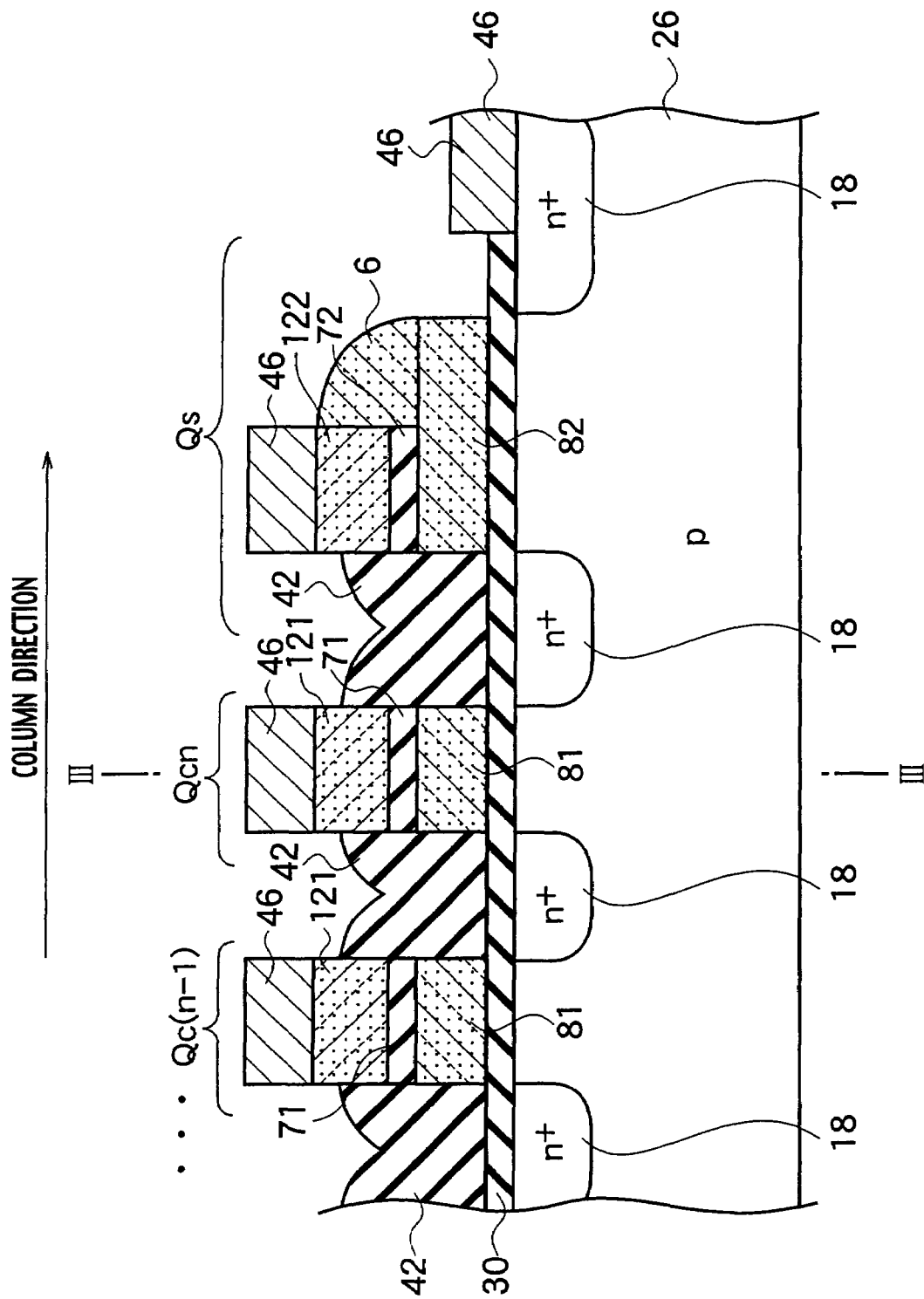
FIG. 22 is a schematic cross-sectional diagram illustrating a step of the nonvolatile semiconductor memory fabrication method according to the first embodiment of the present invention.

Next, as shown in FIG. 22, once the mask insulator film 40 is removed, a salicide process may be carried out across the entire surface of the device, forming the salicide films 46 on the first control gates 121, the second control gate 122, and the diffusion layers 18 representing the source and the drain region of the select gate transistor $Q_s$. Note that thick inter-layer insulator films 42 may be filled in between the sidewall regions of the memory cell transistors $Q_{cn}$, $Q_{c(n-1)}$, $Q_{c(n-2)}$, . . . .

The structure shown in FIGS. 3 and 4 corresponds to a structure with the thick interlayer insulator films 42 omitted in FIG. 22.

Figure 23:
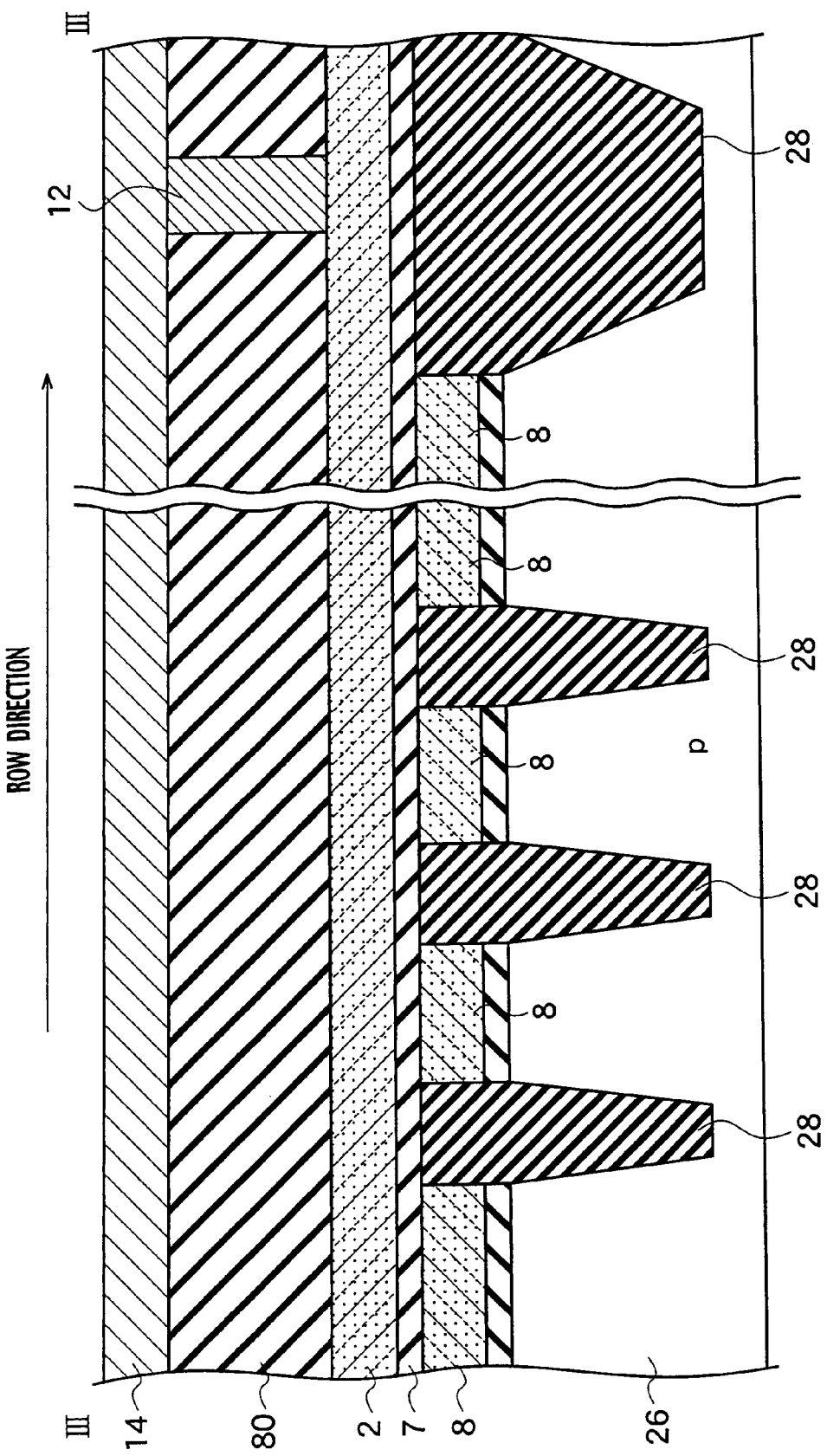
FIG. 23 is a schematic cross-sectional diagram illustrating a step of a nonvolatile semiconductor memory fabrication method according to a first embodiment of the present invention.

Subsequent to the process of FIG. 18, as shown in FIG. 23, once the mask insulator film 40 is removed, a thick inter-layer insulator film 80 is deposited across the entire surface of the device, and above the device isolating regions 28 in the peripheral areas, a via contact 12 as well as a metallic material for a word line 14 are formed in a mask patterning step. The control gate 2 is connected to the word line 14 by the via contact 12.

FIG. 23 corresponds to a device cross-sectional structure cut along the word line WL direction, and represents a process subsequent to the structure in FIG. 20, which represents the device cross-sectional structure cut along the line III-III.

Note that the control gate 2, the first control gates 121, and the second control gate 122 may be made not only of polysilicon, but in a single layer of titanium, tungsten, or titanium nitride, or multi-levels thereof. This configuration is advantageous in terms of miniaturization, as compared to polysilicon in that it can be easily thinly formed and have low resistance.

Alternatively, the control gate 2, the first control gates 121, and the second control gates 122 may be made not only of polysilicon, but may have a salicide structure of a metal such as titanium, cobalt, or nickel.

Alternatively, the first control gates 121 may be connected to an interconnect, for example, the word line WL made of a metal such as tungsten (W), aluminum (Al), titanium (Ti), or copper (Cu). Similarly, the second control gates 122 may be connected to interconnects, for example, select gate lines SGD, SGS or the like made of a metal such as tungsten (W), aluminum (Al), titanium (Ti), or copper (Cu).

Modified Example of the First Embodiment

Figure 19:
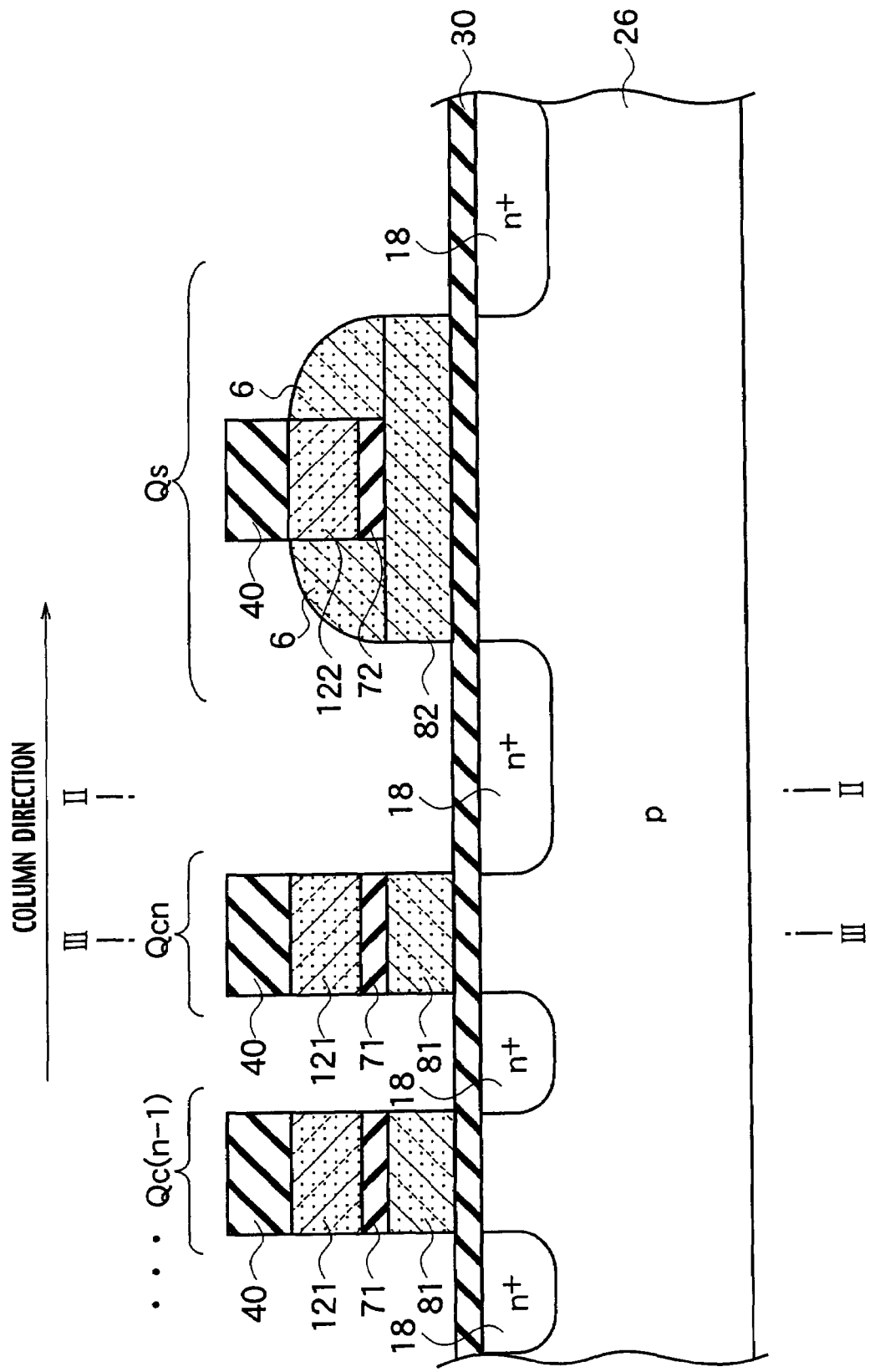
FIG. 19 is a schematic cross-sectional diagram illustrating the nonvolatile semiconductor memory according to the first embodiment of the present invention, and a step of the fabrication method thereof.

The structure of the modified example of the first embodiment of the present invention, as shown in FIG. 19, has the sidewall gates 6 disposed on both sidewalls of the second inter-gate insulator film 72 and the control gate 122 of each select gate transistors $Q_s$. Compared to the structure of the first embodiment with the sidewall gate 6 disposed on one sidewall of the second inter-gate insulator film 72 and the control gate 122, the area occupied by the select gate transistor increases; however, by forming the sidewall gate 6 on both sides, the gate resistance of the select gate transistor Qs is reduced, and control characteristics such as cut-off characteristics may enhance.

Note that the fabrication method is the same as that of the nonvolatile semiconductor memory according to the first embodiment of the present invention described in FIG. 5 through FIG. 18 with only a difference of using a different mask pattern.

FIG. 20 shows a schematic device cross-sectional structure cut along the line III-III of FIG. 19, or in other words, a cross-sectional structure cut along the word line WL direction. In addition, FIG. 21 shows a schematic device cross-sectional structure cut along the line II-II, or in other words, a cross-sectional structure cut along the word line WL direction. The device isolating regions 28 being formed at a lower position than that of FIG. 20 is the same as that in FIG. 13. The rest of the fabrication processed are the same as the processed in FIGS. 22 and 23, and description thereof is omitted.

SECOND EMBODIMENT

The structure of a nonvolatile semiconductor memory according to a second embodiment of the present invention is the same as that of the nonvolatile semiconductor memory according to the first embodiment shown in FIGS. 3 and 4.

With a nonvolatile semiconductor memory fabrication method according to the second embodiment of the present invention, since the steps of FIG. 5 through FIG. 14 are common to those of the first embodiment, description thereof is omitted.

Figure 24:
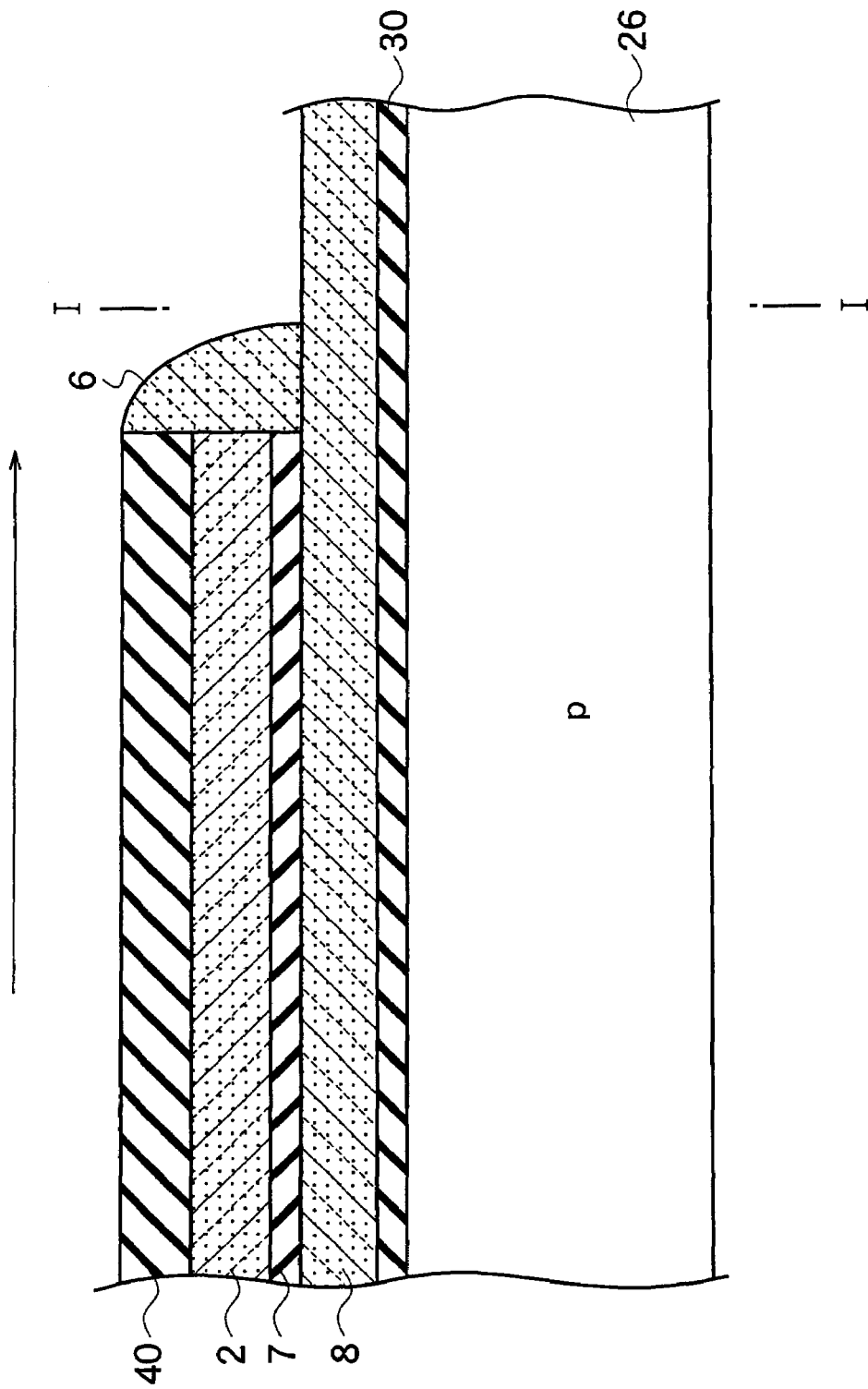
FIG. 24 is a schematic device cross-sectional diagram illustrating a step of a nonvolatile semiconductor memory fabrication method according to a second embodiment of the present invention.

Subsequent to the steps of FIGS. 12 and 13, as shown in FIG. 24, the entire surface is etched until the surface of the mask insulator film 40 is exposed. Since a natural oxide film is formed on the surface of the floating gate 8 in the step of FIG. 10, even with etching across the entire surface of the device, stopping at the top surface of the floating gate 8 is easy. However, this is possible only if the etching stops higher than the gate oxide film.

Figure 25:
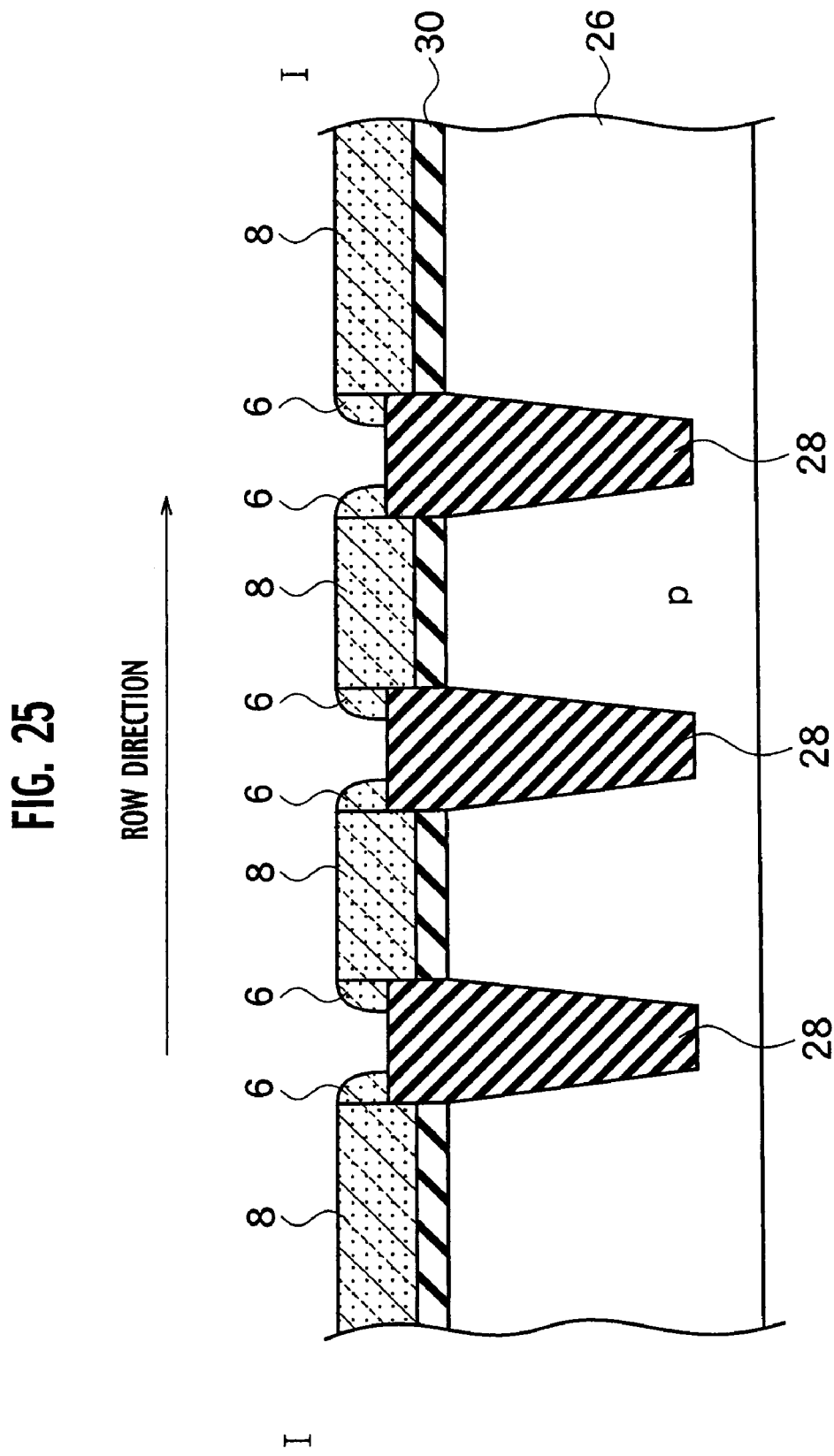
FIG. 25 is a schematic device cross-sectional diagram cut along the line I-I of FIG. 24.

FIG. 25 shows a schematic device cross-sectional structure cut along the line I-I of FIG. 24. In FIG. 25, a part of the sidewall gates 6 is left on the corresponding sidewall portion of each floating gate 8. Formation of the surface of the device isolating regions 28 at a low position prevents short circuits of neighboring floating gates 8. If the surface of the device isolating regions 28 is substantially the same or higher than the top of the floating gates 8 in the regions etched in the step of FIG. 10, the polysilicon of the sidewall gates 6 remains on top of the floating gates 8, and the neighboring floating gates 8 may short circuit. Therefore, forming the surface of the device isolating regions 28 at a low position and accurately etching the polysilicon for the sidewall gates 6 is important.

Figure 26:
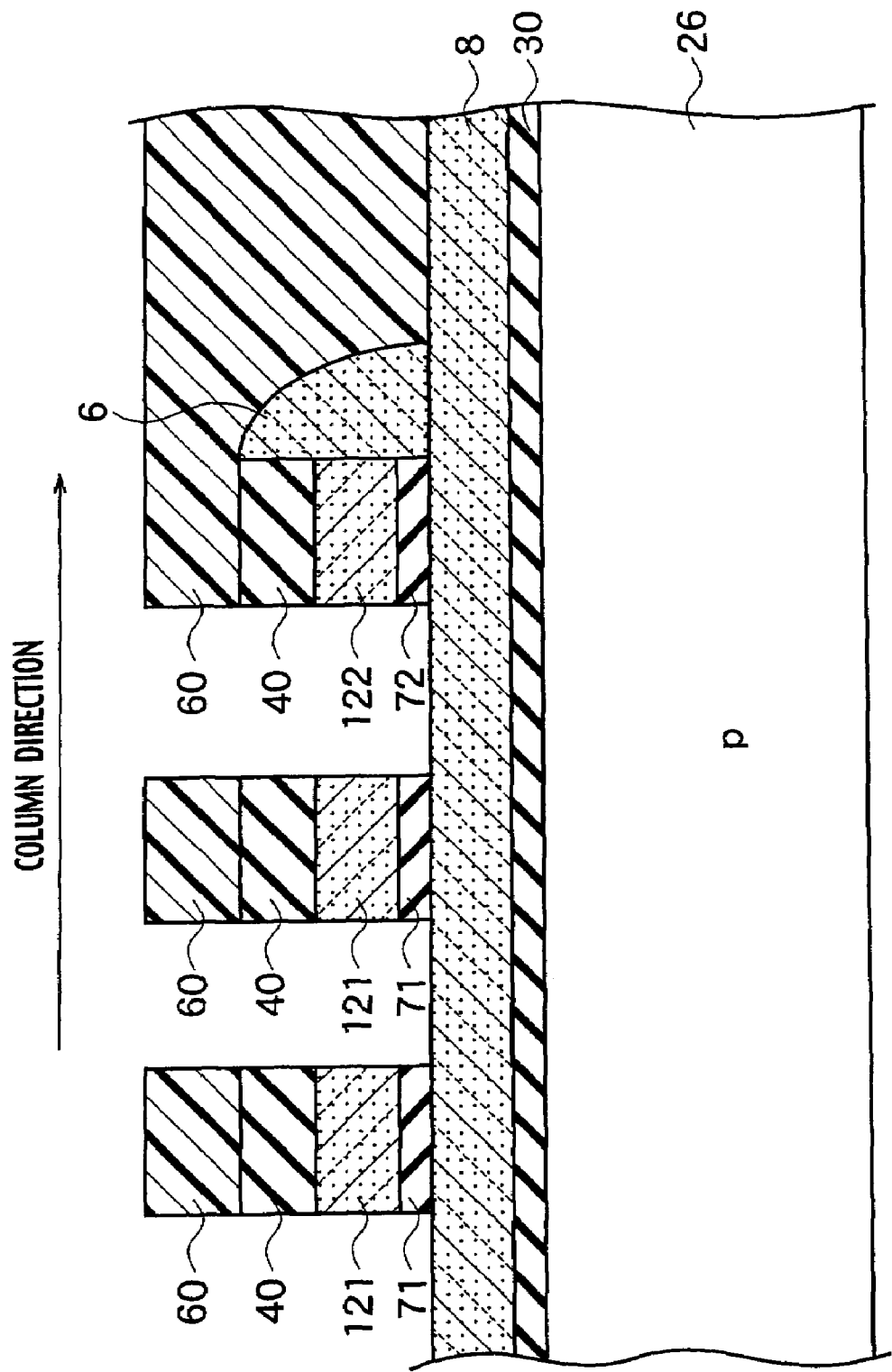
FIG. 26 is a schematic device cross-sectional diagram illustrating a step of the nonvolatile semiconductor memory fabrication method according to the second embodiment of the present invention.

Next, as shown in FIG. 26, once the resist 60 is applied across the entire surface of the device, the mask insulator film 40, the polysilicon for the control gate 2 and the inter-gate insulator film 7 (71, 72) are removed, dividing the entire surface region of the device into memory cell transistor regions and select gate transistor regions through lithography and etching.

Figure 27:
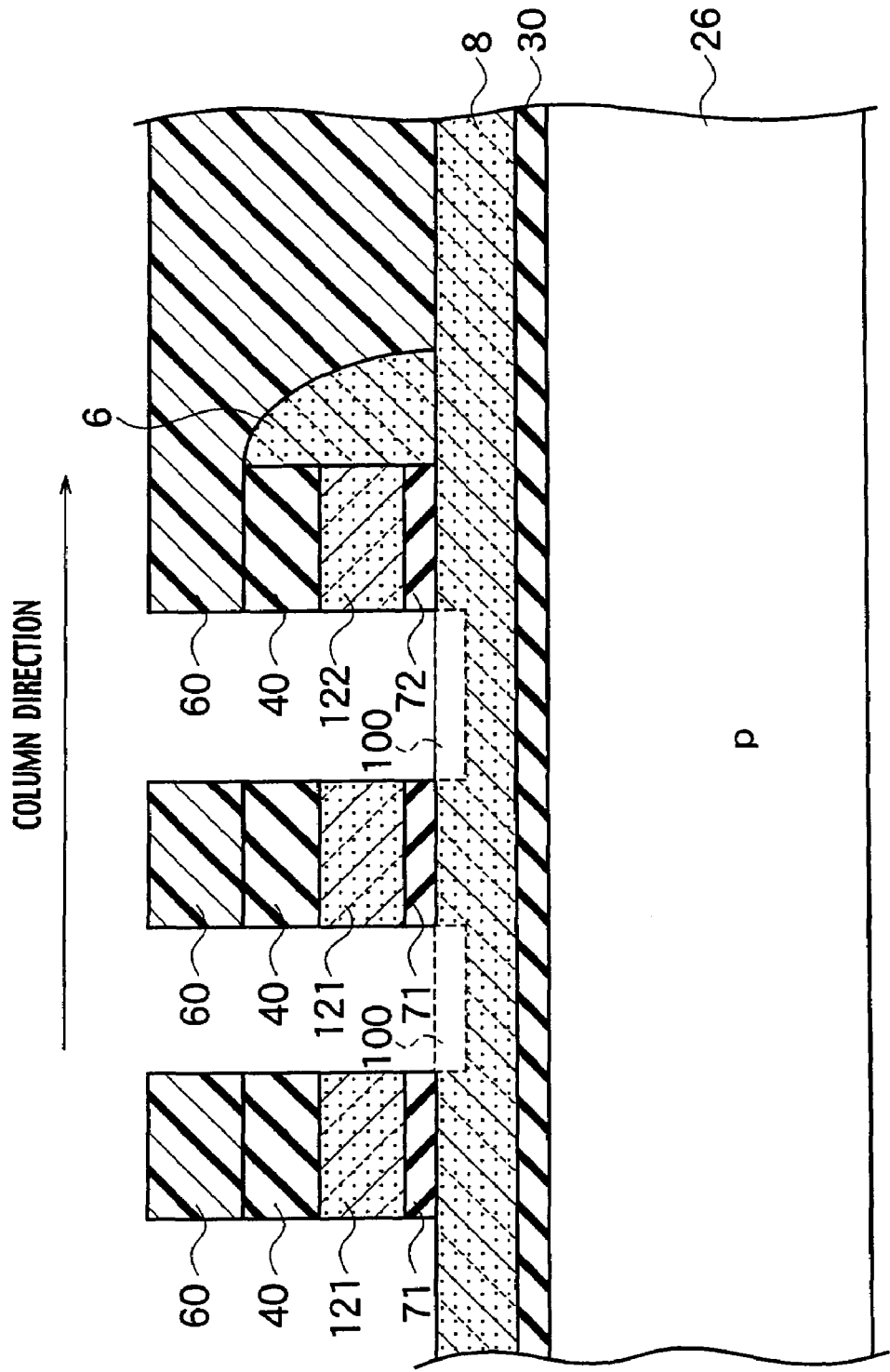
FIG. 27 is a schematic device cross-sectional diagram illustrating a step of the nonvolatile semiconductor memory fabrication method according to the second embodiment of the present invention.

Next, as shown in FIG. 27, the floating gate 8 may be shallowly etched by forming etching trenches 100. Making the etched surface end at the top surface of the floating gate 8 is favorable to guarantee isolation characteristics between neighboring memory cell transistors, and ending the etched surface higher than the gate oxide film 30 is necessary in order to prevent from making damage to the gate oxide film 30 during the trench etching process.

Next, as with the step illustrated in FIG. 18, once the resist 60 is removed, the polysilicon for the floating gate 8 is removed through RIE or the like, and further through an ion implantation step. The diffusion layers 18 of the memory cell transistors $Q_{cn}$, $Q_{c(n-1)}$, $Q_{c(n-2)}$, . . . and the select gate transistors $Q_s$ are formed.

Next, as with the step illustrated in FIG. 22, once the resist 40 is removed, by carrying out a salicide process across the entire surface of the device, the salicide films 46 may be formed upon the first control gates 121, the second control gates 122, and the diffusion layers 18, which represent the source and the drain regions of the select gate transistors $Q_s$. Note that thick inter-layer insulator films 42 may be filled in between the sidewall portions of the $Q_{cn}$, $Q_{c(n-1)}$, $Q_{c(n-2)}$, . . . .

In FIG. 22, as is apparent from the structure shown in FIG. 4, which corresponds to a structure with the thick inter-layer insulator films 42 omitted, the sidewall gate 6 remains in one sidewall portion of the select gate transistor $Q_s$, and the second floating gate 82 and the second control gate 122 short circuit. A structure short-circuited on both sides may be employed as in FIG. 19.

Next, subsequent to the step of FIG. 18, as shown in FIG. 23, once the mask insulator film 40 is removed, a thick interlayer insulator film 80 is deposited across the entire surface of the device, and through a mask patterning step, the via contact 12 and a metallic material for the word line 14 are formed upon the device isolating regions 28 in a peripheral area. The control gate 2 is connected to the word line 14 by the via contact 12.

FIG. 23 corresponds to a device cross-sectional structure cut along the word line WL direction, and represents a step subsequent to the structure of FIG. 20, which represents the device cross-sectional structure cut along the line III-III.

Note that the control gate 2, the first control gates 121, and the second control gates 122 may be formed not only of polysilicon, but in a single layer of titanium, tungsten, or titanium nitride, or multi-levels thereof. This configuration is advantageous in terms of miniaturization compared to polysilicon in that it can be easily thinly formed and has low resistance.

Alternatively, the control gate 2, the first control gates 121, and the second control gates 122 may have a salicide structure of not only polysilicon, but a metal such as titanium, cobalt, or nickel as well.

Alternatively, the first control gates 121 may be connected to an interconnect, for example, the word line WL made of a metal such as tungsten (W), aluminum (Al), titanium (Ti), or copper (Cu). Similarly, the second control gates 122 may be connected to interconnect, for example, the select gate lines SGD, SGS or the like made of a metal such as tungsten (W), aluminum (Al), titanium (Ti), or copper (Cu).

THIRD EMBODIMENT (NAND Structure)

Figure 28:
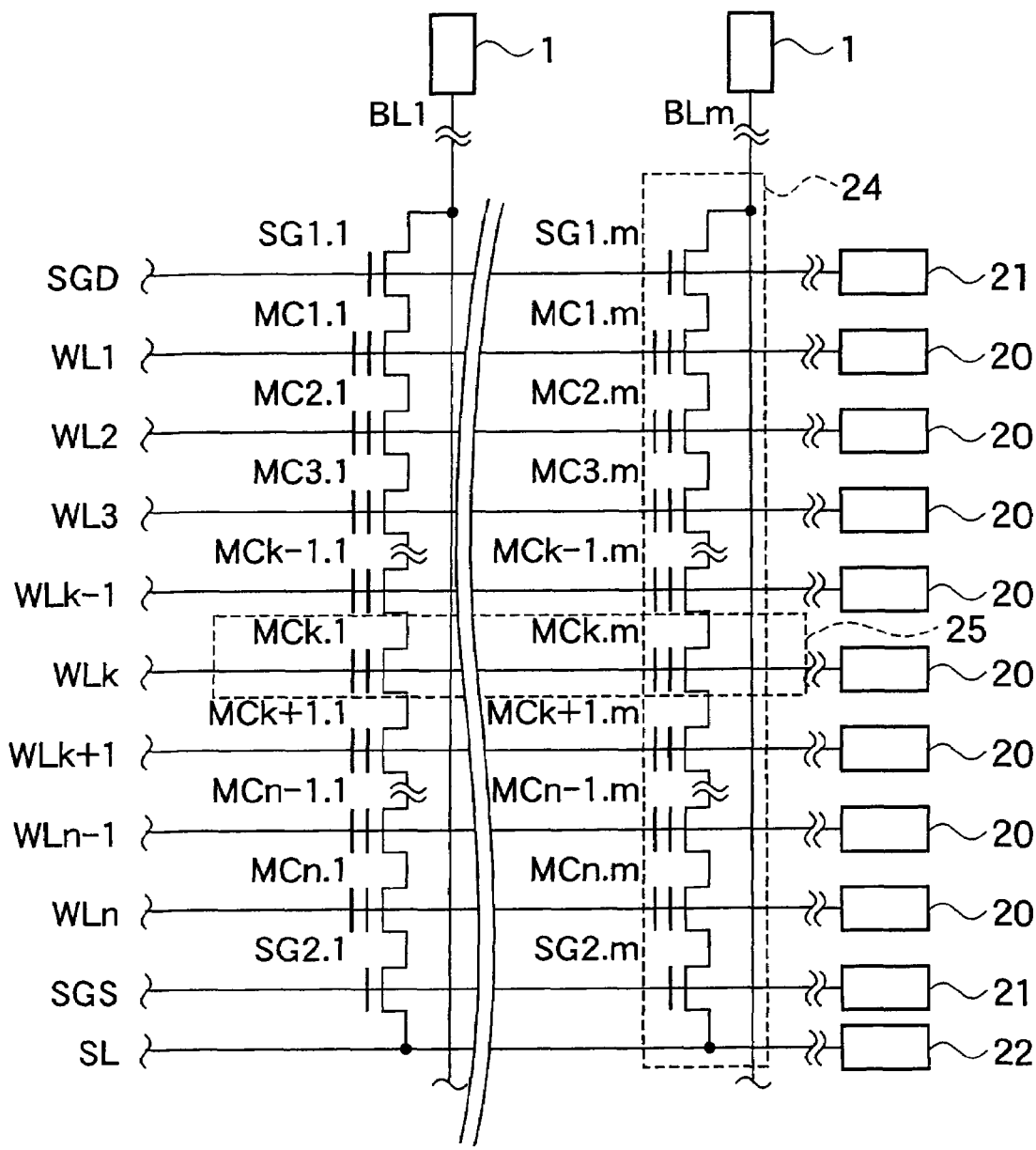
FIG. 28 is a diagram showing an exemplary NAND circuit structure of a nonvolatile semiconductor memory according to a third embodiment of the present invention.

A NAND structure is shown in FIG. 28 as an exemplary circuit structure of a nonvolatile semiconductor memory according to a third embodiment of the present invention.

FIG. 28 shows an example configured with the nonvolatile semiconductor memory according to the first and the second embodiment of the present invention structured as an exemplary NAND memory cell array.

The select gate transistors have a structure with the second floating gate 82, the second inter-gate insulator film 72, and the second control gate 122 stacked upon the semiconductor substrate 26 via the gate insulator film 30, and the second floating gate 82 and the second control gate 122 being short circuited due to the sidewall gate 6 as is described in FIG. 3 through FIG. 27. Furthermore, the memory cell transistors having a structure with the first floating gate 81, the first inter-gate insulator film 71, and the first control gate 121 being stacked upon the semiconductor substrate 26 via the gate insulating film 30 is as described using FIG. 3 through FIG. 27.

Each NAND cell unit 24 is configured by serially connecting n memory cell transistors (MC1,m to MCn,m) so that adjacent memory cell transistors share either their source or drain diffusion layer, and further arranging a select gate transistor (SG1.m and SG2.m) at both ends thereof. A NAND memory cell array has the above NAND cell units 24 arrayed in a matrix. The span of NAND cell units 24 in the same column is a NAND cell block. The drain of one of the select gate transistors (SG1.m) for each NAND cell unit 24 is connected to the bit line (BLm), and the source of the other select gate transistor (SG2.m) is connected to the source line (SL), which is shared by multiple NAND cell units 24. The control gates of multiple memory cell transistors and select gate transistors horizontally arranged in the NAND memory cell array are connected in common to control gate lines (word lines) WL and the select gate lines SGD and SGS, respectively. All memory cell transistors 25 connected to a single word line configure a range in which data write-in can be collectively performed. This write-in unit is normally defined as one page; however recently, there are cases where multiple pages are allotted to a single control gate. In the case where there are n memory cell transistors in the NAND cell unit 24, there are n control gate lines in a memory cell block. Bit lines BL1 and BL2 are connected to bit line drive circuits 1, respectively, the control gate lines WL are connected to control gate line drive circuits 20, respectively, the select gate lines are connected to select gate line drive circuits 21, respectively, and the source line is connected to a source line drive circuit 22.

With the nonvolatile semiconductor memory according to the third embodiment of the present invention, even in the NAND-type circuit structure, as miniaturization continues and the floating gate 8 is a thin film, contact resistance decreases. Further, yield can be improved with easy processing due to a short-circuit structure utilizing the sidewall gates 6 in the select gate transistors.

Note that the number of select gate transistors is not limited to one, and a circuit structure with multiple select gate transistors connected in series may be provided. Even in that case, as miniaturization progresses and the floating gate 8 is a thin film, contact resistance decreases, and an improved yield can be anticipated with easy processing due to a short-circuit structure utilizing the sidewall gates 6.

FOURTH EMBODIMENT (AND Structure)

Figure 29:
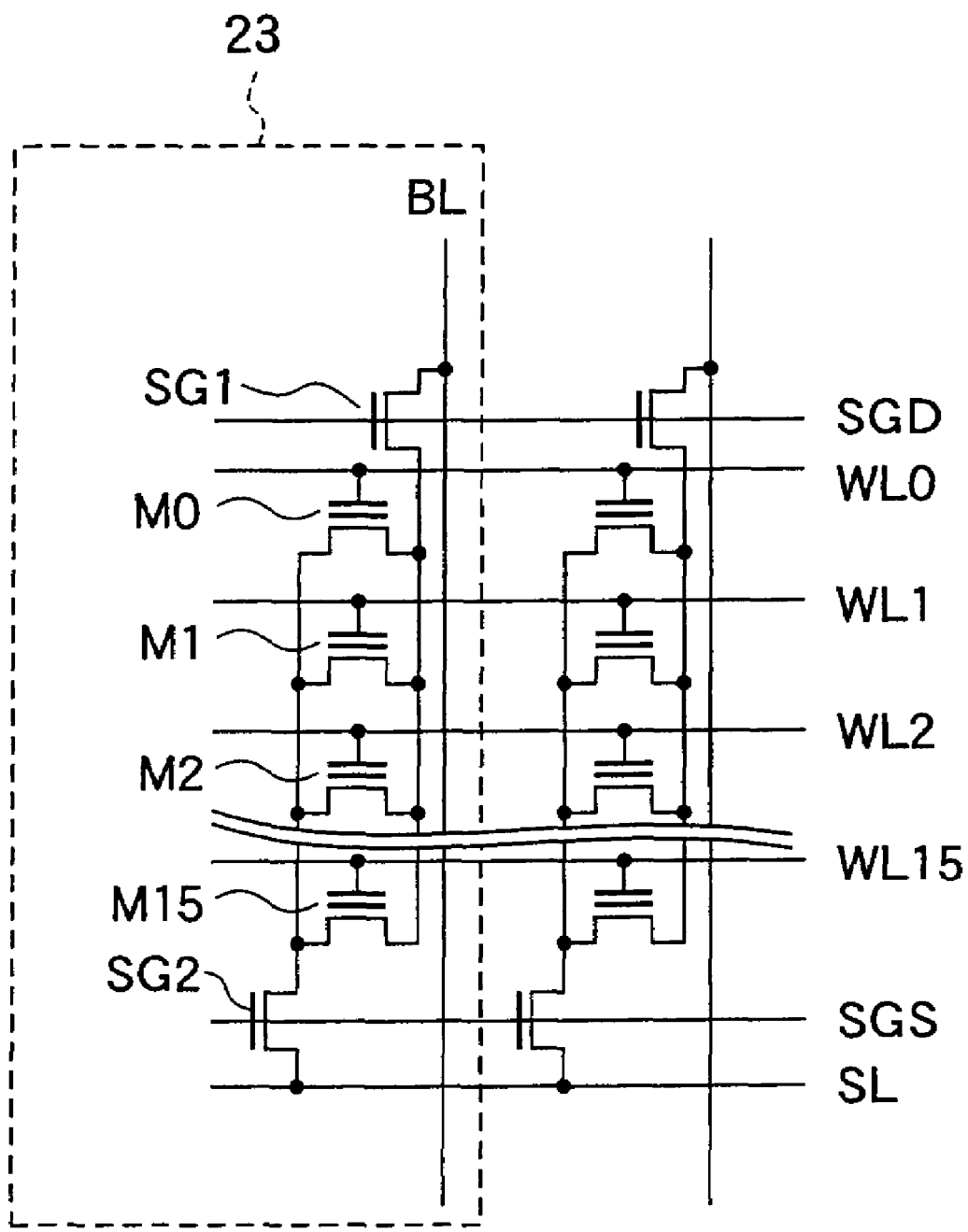
FIG. 29 is a diagram showing an exemplary AND circuit structure of a nonvolatile semiconductor memory according to a fourth embodiment of the present invention.

An AND structure is shown in FIG. 29 as an exemplary circuit structure of a nonvolatile semiconductor memory according to a fourth embodiment of the present invention.

FIG. 29 shows an example configured with the nonvolatile semiconductor memory according to the first and the second embodiment of the present invention structured as an exemplary AND memory cell array.

The select gate transistors have a structure comprising the second floating gate 82, the second inter-gate insulator film 72, and the second control gate 122 stacked upon the semiconductor substrate 26 via the gate insulator film 30, and the second floating gate 82 and the second control gate 122 being short circuited due to the sidewall gate 6, as is described referencing FIG. 3 through FIG. 27. Furthermore, the memory cell transistors having a structure with the first floating gate 81, the first inter-gate insulator film 71, and the first control gate 121 being stacked upon the semiconductor substrate 26 via the gate insulating film 30 is as described using FIG. 3 through FIG. 27.

The reference numeral 23 enclosed by a dotted line in FIG. 29 denotes an AND cell unit. In the AND cell unit 23, respective drain regions of memory cell transistors MO to M15 are connected in common, and respective source regions are also connected in common. In other words, in a memory cell unit of an AND flash memory as shown in FIG. 29, the memory cell transistors MO to M15 are connected in parallel, where a single bit line side select transistor SG1 is connected on one side thereof, and a single source line side select transistor SG2 is connected on the other side. Each of the memory cell transistors M0 to M15 is connected one to one to a word line WL0 to WL15, respectively. The gate of the bit line side select transistor SG1 is connected to the select gate line SGD. The gate of the source line side select transistor SG2 is connected to the select gate line SGS. The drain of the bit line side select transistor SGS1 is connected to the bit line BL, which is a data line. The source of the source line side select transistor SG2 is connected to the source line SL.

With the nonvolatile semiconductor memory according to the fourth embodiment of the present invention, even in the AND-type circuit structure, as miniaturization progresses and the floating gate 8 is a thin film, contact resistance decreases, and yield is improved with easy processing due to a short-circuit structure utilizing the sidewall gates 6 in the select gate transistors.

For securing select gate transistor cut-off characteristics, a structure with not just one but multiple select gate transistors connected in series may be employed. Even in that case, as miniaturization progresses and the floating gate 8 is a thin film, contact resistance decreases, and yield is improved with easy processing due to a short-circuit structure utilizing the sidewall gates 6.

FIFTH EMBODIMENT (NOR Structure)

Figure 30:
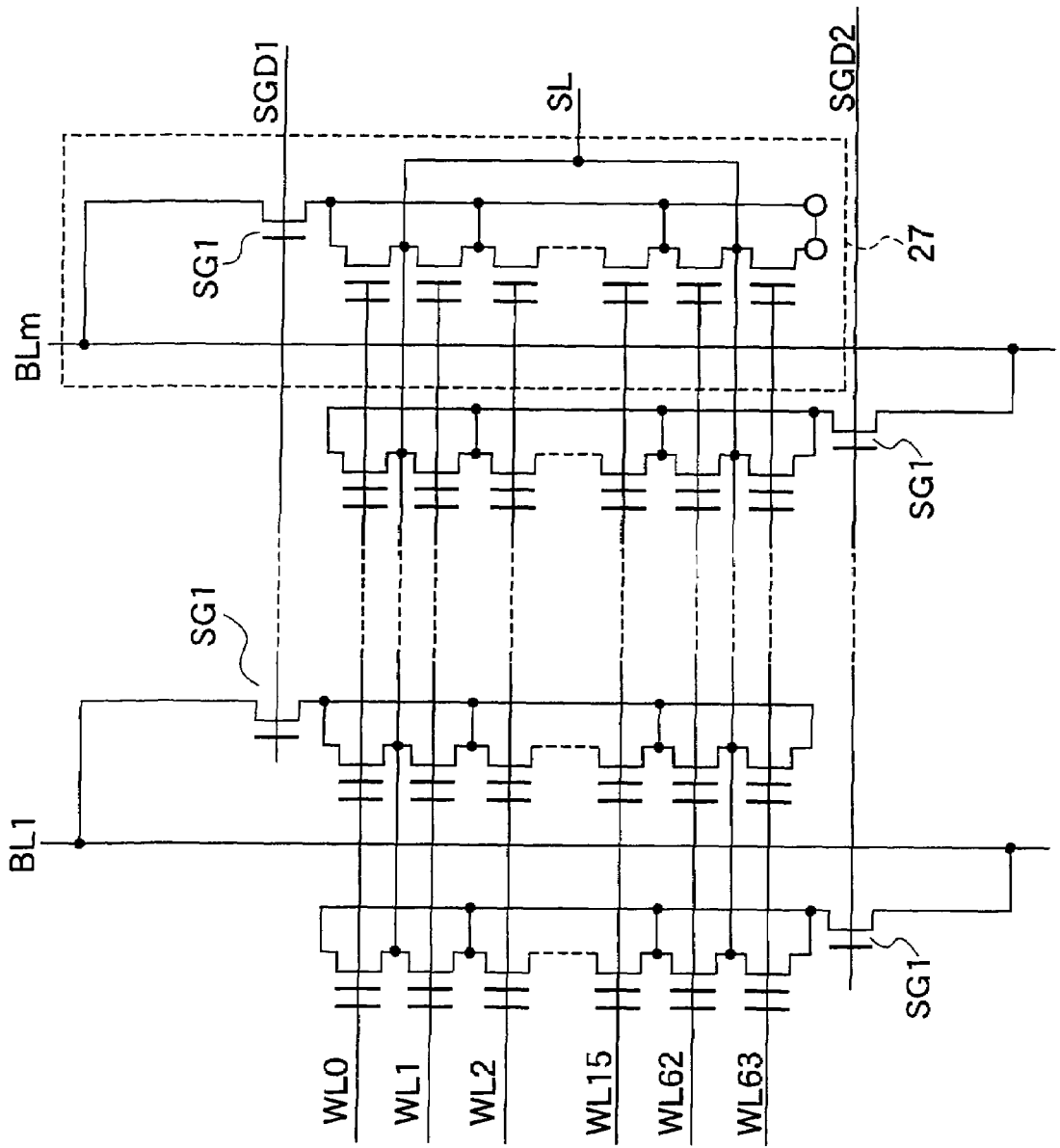
FIG. 30 is a diagram showing an exemplary NOR circuit structure of a nonvolatile semiconductor memory according to a fifth embodiment of the present invention.

A divided bit line (DI) NOR structure is shown in FIG. 30 as an exemplary circuit structure of a nonvolatile semiconductor memory according to a fifth embodiment of the present invention. FIG. 30 shows an example of the nonvolatile semiconductor memory according to the first and the second embodiment of the present invention structured using an exemplary NOR memory cell array.

The select gate transistors have a structure with the second floating gate 82, the second inter-gate insulator film 72, and the second control gate 122 stacked upon the semiconductor substrate 26 via the gate insulator film 30, and the second floating gate 82 and the second control gate 122 being short circuited due to the sidewall gate 6, as is described referencing FIG. 3 through FIG. 27. Furthermore, the memory cell transistors having a structure with the first floating gate 81, the first inter-gate insulator film 71, and the first control gate 121 being stacked upon the semiconductor substrate 26 via the gate insulating film 30 is as described using FIG. 3 through FIG. 27.

The reference numeral 27 enclosed by a dotted line in FIG. 30 denotes a NOR cell unit. In the NOR cell unit 27, the common source region of two adjacent memory cell transistors is connected to the source line SL, and the common drain region thereof is connected to the bit line BL. The NOR cell unit is characterized by a faster read-out operation than with the NAND structure.

With the nonvolatile semiconductor memory according to the fifth embodiment of the present invention, even using the NOR-type circuit structure, as miniaturization progresses and the floating gate 8 is a thin film, contact resistance decreases, and yield is improved with easy processing due to a short-circuit structure utilizing the sidewall gates 6 in the select gate transistors.

For securing select gate transistor cut-off characteristics, a structure with not just one but multiple select gate transistors connected in series may be employed. Even in that case, as miniaturization progresses and the floating gate 8 is a thin film, contact resistance decreases, and yield is improved with easy processing due to a short-circuit structure utilizing the sidewall gates 6.

SIXTH EMBODIMENT (System Block Structure)

Figure 31:
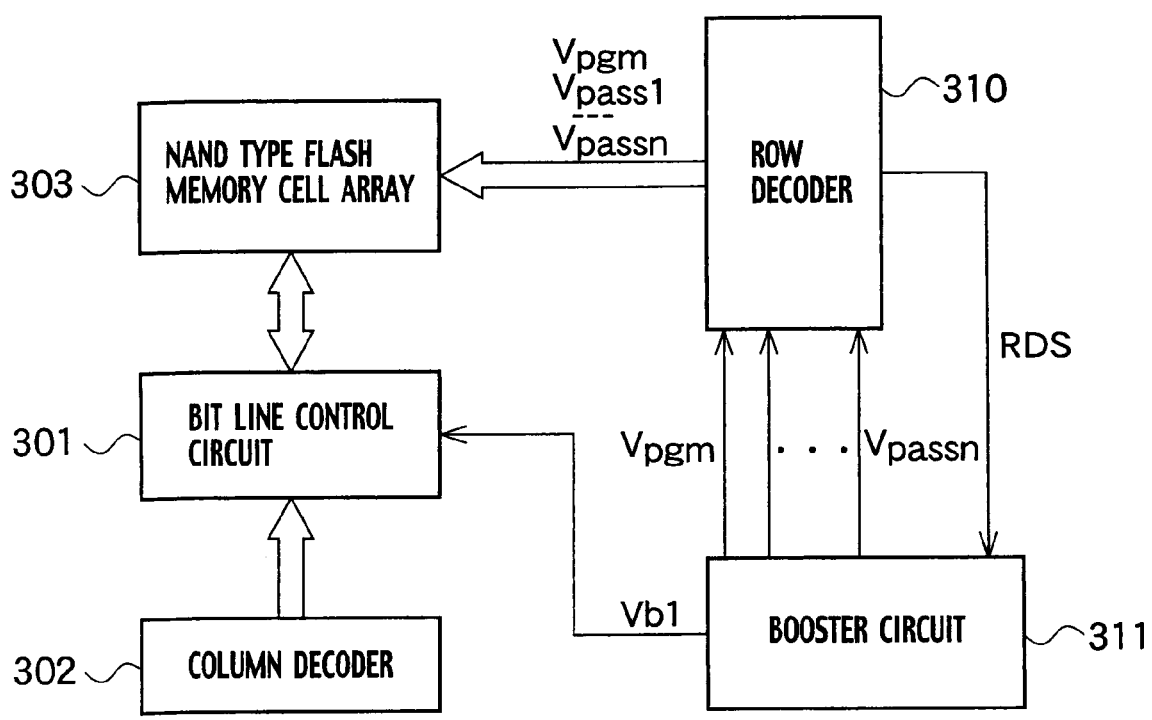
FIG. 31 is a diagram showing an exemplary system block structure of a nonvolatile semiconductor memory according to a sixth embodiment of the present invention.

The exemplary system block structure of the nonvolatile semiconductor memory according to the first through the third embodiment of the present invention as shown in FIG. 31 is configured with a NAND flash memory cell array 303, a bit line control circuit 301, a row decoder 310, a column decoder 302, and a booster circuit 311. The nonvolatile memory cell array described with FIG. 28 may be applied to the NAND flash memory array 303. In other words, in the NAND flash memory cell array 303, NAND memory cell units 24, each having a multilayer stacked gate structure as a basic memory cell transistor, are vertically and horizontally arranged in a matrix so as to arrange the word lines WL1 to WLn, which are connected to the respective control gates 2, the bit lines BL1 to BLm, the select gate lines SGD and SGS, and the source line SL and the like. The bit line control circuit 301 and the row decoder 310 are connected to the NAND flash memory cell array 303. The bit line control circuit 301 latches write-in data, performs a sensing operation during read-out, and performs related operations. The column decoder 302, which decodes a column address signal so as to select a NAND cell unit column, is connected to the bit line control circuit 301. The booster circuit 311 generates a write-in voltage $V_{pgm}$, different multiple intermediate voltages $V_{pass1}$ to $V_{passn}$, and a bit line voltage $V_{b1}$ and the like from a power supply voltage. The row decoder 310 supplies a control signal RDS to the booster circuit 311, and receives the write-in voltage $V_{pgm}$ and the intermediate voltages $V_{pass1}$ to $V_{passn}$. It should be noted that the multiple intermediate voltages $V_{pass1}$ to $V_{passn}$ are used for the write-in, read-out and erasure operations for the nonvolatile semiconductor memory according to the embodiments of the present invention, and are mainly applied to the word lines WL1 to WLn, respectively. The row decoder 310 decodes a row address signal, and based on the voltage supplied from the booster circuit 311, outputs the decoded signals, such as the write-in voltage $V_{pgm}$, which is used to select a memory cell transistor in the NAND flash memory cell array 303, the intermediate voltages $V_{pass1}$ to $V_{passn}$, voltage $V_{sgs}$ to be applied to the select gate line SGS, the voltage $V_{sgd}$ to be applied to the select gate line SGD, and the voltage $V_{s1}$ to be applied to the source line SL. Accordingly, word lines and select gate lines in the NAND flash memory cell array 303 are selected. Furthermore, the bit line control circuit 301 receives the bit line voltage $V_{b1}$ from the booster circuit 311, supplying the bit line voltage $V_{b1}$ to a NAND cell unit column selected by the column decoder 302. It should be noted that only the minimum circuit configuration is shown in FIG. 31, and in addition to this configuration, an address buffer, a data input/output buffer, and a timing generation circuit and the like are additional components of the system block, however, descriptions thereof are omitted.

SEVENTH EMBODIMENT

Figure 32:
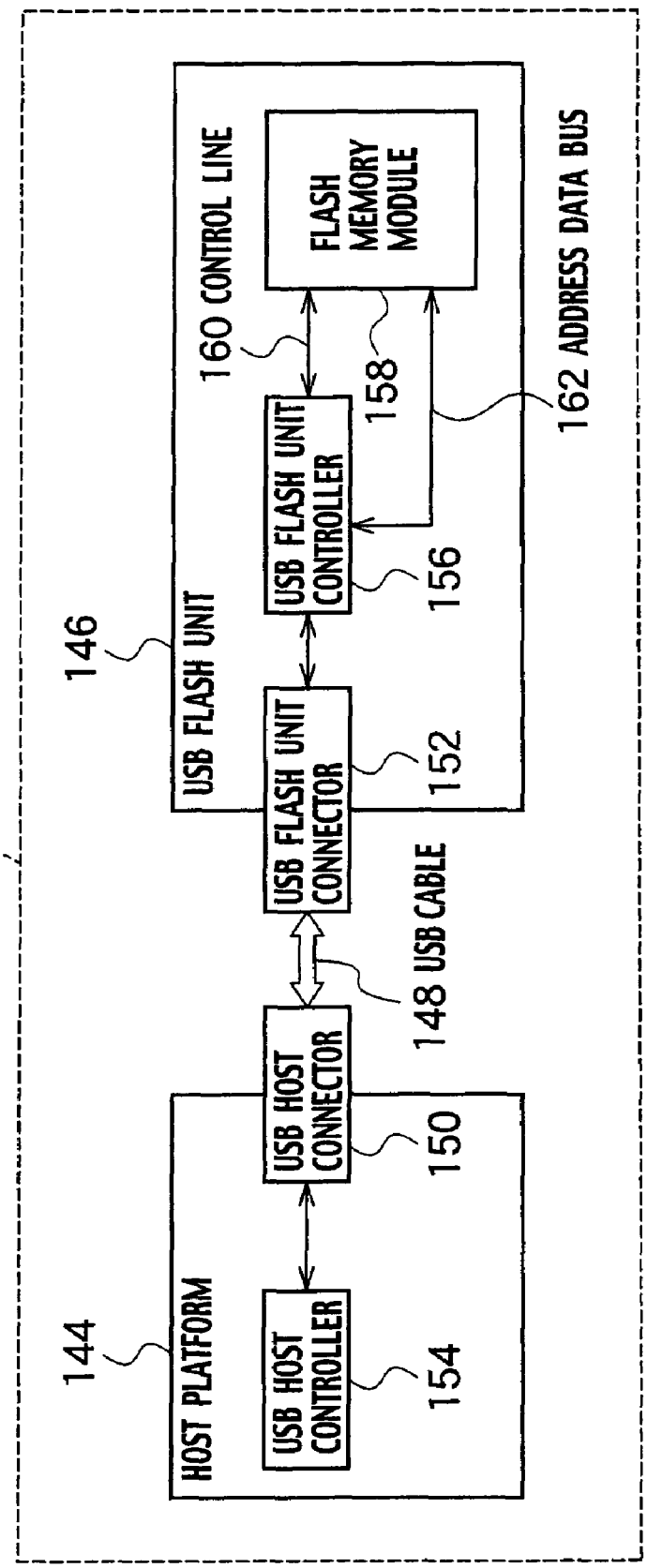
FIG. 32 illustrates an application example for the nonvolatile semiconductor memory according to the first through the sixth embodiment of the present invention, and is a seventh embodiment of the present invention.

An application example of the nonvolatile semiconductor memory according to the first through the sixth embodiment of the present invention, as a seventh embodiment, is illustrated in FIG. 32. FIG. 32 is a schematic diagram of principal elements of a flash memory and system according to this embodiment. As shown in the drawing, a flash memory system 142 is configured with a host platform 144 and a universal serial bus (USB) flash unit 146.

The host platform 144 is connected to the USB flash unit 146 via a USB cable 148. The host platform 144 is connected to the USB cable 148 via a USB host connector 150, and the USB flash unit 146 is connected to the USB cable 148 via a USB flash unit connector 152. The host platform 144 has a USB host controller 154, which controls packet transmission through a USB bus.

The USB flash unit 146 includes a USB flash unit controller 156, which controls other elements in the USB flash unit 146 as well as controls the interface to the USB bus of the USB flash unit 146; the USB flash unit connector 152; and at least one flash memory module 158 configured with the nonvolatile semiconductor memory according to the first through the sixth embodiment of the present invention.

When the USB flash unit 146 is connected to the host platform 144, standard USB enumeration processing begins. In this processing, the host platform 144 recognizes the USB flash unit 146, selects the mode for transmission therewith, and conducts reception/transmission of data from/to the USB flash unit 146 via a FIFO buffer called an end point, which stores transfer data. The host platform 144 recognizes changes in the physical and electrical states such as removal/attachment of the USB flash unit 146 via another end point, and receives any existing to-be-received packets.

The host platform 144 requests services from the USB flash unit 146 by sending a request packet to the USB host controller 154. The USB host controller 154 transmits the packet to the USB cable 148. If the USB flash unit 146 is a unit including the end point that has received the request packet, the request will be accepted by the USB flash unit controller 156.

Next, the USB flash unit controller 156 performs various operations such as read-in, write-in or erasure of data from or to the flash memory module 158. In addition, the USB flash unit controller 156 supports basic USB functions such as acquiring a USB address and the like. The USB flash unit controller 156 controls the flash memory module 158 via either a control line 160, which is used to control output from the flash memory module 158, or, for example, other various signals such as a chip enable signal CE, a read-out signal, or a write-in signal. Furthermore, the flash memory module 158 is also connected to the USB flash unit controller 156 via an address data bus 162. The address data bus 162 transfers a read-out, a write-in or an erasure command for the flash memory module 158, and the address and data for the flash memory module 158.

In order to notify the host platform 144 of the results and status of the various operations requested by the host platform 144, the USB flash unit 146 transmits a status packet using a status end point (end point 0). In this processing, the host platform 144 checks (polls) for the existence of a status packet, and the USB flash unit 146 returns an empty packet or a status packet when there is no packet for a new status message.

As described thus far, various functions of the USB flash unit 146 may be implemented. Directly connecting the connectors is also possible by omitting the USB cable 148 described above.

OTHER EMBODIMENTS

As described above, the present invention is described according to various embodiments, however, it should not be perceived that descriptions and drawings forming a part of this disclosure are intended to limit the spirit and scope of the present invention. Various alternative embodiments, working examples, and operational techniques will become apparent from this disclosure for those skills in the art. Accordingly, the technical scope of the present invention is determined only by specified features of the invention according to the following claims that can be regarded appropriate from the above-mentioned descriptions. In addition, the embodiments of the present invention can be modified and implemented in various ways as long as not deviating from the scope of the present invention. The present invention naturally includes various embodiments not described herein.

What is claimed is:

1. A non-volatile semiconductor memory device comprising:
    a semiconductor substrate;
    a first insulating film formed on the semiconductor substrate;
    a memory cell transistor including a floating gate disposed on the first insulating film, a first inter-gate insulating film formed on the floating gate and a control gate formed on the first inter-gate insulating film; and
    a select gate transistor formed on the first insulating film adjacent to the memory cell transistor, the select gate transistor including a lower gate portion having an upper surface which has a first region and a second region, a second inter-gate insulating film formed on the first region of the upper surface, an upper gate portion, which has a first side surface, formed on the second inter-gate insulating film, a conductive oxide film formed on the second region of the flat upper surface and the first side surface, and a sidewall gate portion formed on the conductive oxide film, the sidewall gate portion including a second side surface facing to the first side surface of the upper gate portion via the conductive oxide film.

2. The non-volatile semiconductor memory according to claim 1, wherein the select gate transistor further includes a second sidewall gate portion formed on a third region of the upper surface of the lower gate portion and including a third side surface facing to a fourth side surface of the upper gate portion.

3. The nonvolatile semiconductor memory device of claim 1, wherein the first and the second inter-gate insulating films include a single layer of any one of an aluminum oxide, hafnium oxide, silicon oxide, silicon nitride, or zirconium oxide.

4. The nonvolatile semiconductor memory device of claim 1, wherein the floating gate and the control gates include a polysilicon layer.

5. The nonvolatile semiconductor memory device of claim 1, wherein the control gate includes any one of titanium layer, tungsten layer or titanium nitride layer.

6. The nonvolatile semiconductor memory device of claim 1, wherein the control gate includes a salicide metal film such as titanium, tungsten, cobalt or nickel.

7. A non-volatile semiconductor memory device comprising:
    a semiconductor substrate including a main surface having an active area formed along a predetermined direction;
    a first insulating film formed on the active area;
    a memory cell transistor formed the active area, including a floating gate formed on the first insulating film, a second insulating film formed on the floating gate, a control gate formed on the second insulating film;
    a select gate transistor formed adjacent to the memory cell transistor in the predetermined direction, including a lower gate portion formed on the first insulating film which includes an upper surface having a first region and a second region, a third insulating film formed on the first region of the lower gate portion, an upper gate portion, formed on the third insulating film, including a first side surface, and a sidewall gate portion formed on the second region of the lower gate portion and facing to the first side surface of the upper gate portion;

a first salicide film formed on the control gate; and a second salicide film formed on the upper gate portion without sidewall gate portion.

8. The non-volatile semiconductor memory device according to claim 7, wherein, a height of a top portion of the sidewall gate is same as a height of an upper surface of the upper gate portion relative to the main surface of the semiconductor substrate.

9. The nonvolatile semiconductor memory device of claim 7, wherein the second and the third insulating films include a single layer of any one of an aluminum oxide, hafnium oxide, silicon oxide, silicon nitride, or zirconium oxide.

10. The nonvolatile semiconductor memory device of claim 7, wherein the floating gate and the control gates include a polysilicon layer.

11. The nonvolatile semiconductor memory device of claim 7, wherein the control gate includes any one of titanium layer, tungsten layer or titanium nitride layer.

12. The nonvolatile semiconductor memory device of claim 7, wherein the first and the second salicide film include one of a titanium film, a tungsten film, a cobalt film or a nickel film.

13. A non-volatile semiconductor memory device comprising:

a semiconductor substrate including a main surface having an active area formed along a predetermined direction;

a first insulating film formed on the main surface;

a memory cell transistor formed on the active area, including a floating gate formed on the first insulating film, a second insulating film formed on the floating gate and a control gate formed on the second insulating film;

a select gate transistor formed adjacent to the memory cell transistor in the predetermined direction, including a lower gate portion, formed on the first insulating film, which includes an upper surface having a first region, a second region and a third region, a third insulating film formed on the first region of the upper surface, an upper gate portion, formed on the third insulating film, which includes a first side surface and a second side surface, and a first sidewall gate portion formed on the second region of the upper surface and facing to the first side surface of the upper gate portion, and a second sidewall gate portion formed on the third upper region and facing to the second side surface of the upper gate portion.

14. The non-volatile semiconductor memory device according to claim 13, wherein, a height of a top portion of the first and second sidewall gates is same as a height of an upper surface of the upper gate portion relative to the main surface of the semiconductor substrate.

15. The nonvolatile semiconductor memory device of claim 13, wherein the second and the third insulating films include a single layer of any one of an aluminum oxide, hafnium oxide, silicon oxide, silicon nitride, or zirconium oxide.

16. The nonvolatile semiconductor memory device of claim 13, wherein the floating gate and the control gates include a polysilicon layer.

17. The nonvolatile semiconductor memory device of claim 13, wherein the control gate includes any one of titanium layer, tungsten layer or titanium nitride layer.

* * * * *